United States Patent
Asano

(10) Patent No.: US 11,372,753 B2
(45) Date of Patent: Jun. 28, 2022

(54) MEMORY SYSTEM AND METHOD

(71) Applicant: KIOXIA CORPORATION, Minato-ku (JP)

(72) Inventor: Shigehiro Asano, Yokosuka (JP)

(73) Assignee: KIOXIA CORPORATION, Minato-ku (JP)

(*) Notice: Subject to any disclaimer, the term of this patent is extended or adjusted under 35 U.S.C. 154(b) by 69 days.

(21) Appl. No.: 16/433,148

(22) Filed: Jun. 6, 2019

(65) Prior Publication Data

US 2020/0073795 A1 Mar. 5, 2020

(30) Foreign Application Priority Data

Aug. 29, 2018 (JP) .............................. JP2018-160233

(51) Int. Cl.
| | |
|---|---|
| *G06F 12/00* | (2006.01) |
| *G06F 13/00* | (2006.01) |
| *G06F 12/02* | (2006.01) |
| *G11C 11/56* | (2006.01) |
| *G11C 16/16* | (2006.01) |
| *G11C 16/08* | (2006.01) |
| *G11C 16/30* | (2006.01) |
| *G06F 3/06* | (2006.01) |
| *G06F 12/1045* | (2016.01) |
| *G06F 12/1009* | (2016.01) |

(52) U.S. Cl.
CPC ........ *G06F 12/0246* (2013.01); *G06F 3/0656* (2013.01); *G06F 3/0658* (2013.01); *G06F 3/0659* (2013.01); *G06F 3/0688* (2013.01); *G06F 12/1009* (2013.01); *G06F 12/1054* (2013.01); *G11C 11/5635* (2013.01); *G11C 16/08* (2013.01); *G11C 16/16* (2013.01); *G11C 16/30* (2013.01); *G06F 2212/305* (2013.01); *G06F 2212/7201* (2013.01)

(58) Field of Classification Search
CPC .... G06F 3/0656; G06F 3/0658; G06F 3/0659; G06F 3/0688; G06F 12/0246; G06F 12/1009; G06F 12/1054; G06F 2212/305; G06F 2212/7201; G11C 11/5635; G11C 16/08; G11C 16/16; G11C 16/30
USPC ....................................................... 711/103
See application file for complete search history.

(56) References Cited

U.S. PATENT DOCUMENTS

| 5,671,388 A | 9/1997 | Hasbun |
| 9,811,489 B2 | 11/2017 | Suto |

(Continued)

FOREIGN PATENT DOCUMENTS

JP 2016-170759 9/2016

*Primary Examiner* — Sheng Jen Tsai
(74) *Attorney, Agent, or Firm* — Oblon, McClelland, Maier & Neustadt, L.L.P.

(57) ABSTRACT

According to one embodiment, a memory system includes a nonvolatile memory and a controller. The controller selects, as a write mode, at least one of a first mode in which N-bit data is written per memory cell in the nonvolatile memory and a second mode in which M-bit data is written per memory cell in the nonvolatile memory as a write mode. N is equal to or larger than one. M is larger than N. The controller selects the second mode when a reception speed of data, which is received in accordance with acceptance of one or more write commands from the host, is equal to or slower than a threshold, and selects the first mode when the reception speed is faster than the threshold.

14 Claims, 17 Drawing Sheets

(56) References Cited

U.S. PATENT DOCUMENTS

| | | | |
|---|---|---|---|
| 10,353,598 B2* | 7/2019 | Huang | G06F 3/0619 |
| 10,877,664 B2* | 12/2020 | Yao | G06F 3/0679 |
| 2005/0273215 A1* | 12/2005 | Kuge | B60W 40/10 |
| | | | 701/1 |
| 2007/0283081 A1* | 12/2007 | Lasser | G06F 12/0246 |
| | | | 711/103 |
| 2008/0042192 A1* | 2/2008 | Park | H01L 29/4234 |
| | | | 257/324 |
| 2009/0327591 A1* | 12/2009 | Moshayedi | G06F 11/1441 |
| | | | 711/103 |
| 2010/0042773 A1* | 2/2010 | Yeh | G06F 12/0868 |
| | | | 711/103 |
| 2010/0064111 A1* | 3/2010 | Kunimatsu | G06F 12/0804 |
| | | | 711/161 |
| 2010/0115183 A1* | 5/2010 | Araki | G06F 12/0246 |
| | | | 711/103 |
| 2010/0274962 A1* | 10/2010 | Mosek | G06F 12/0868 |
| | | | 711/113 |
| 2011/0041037 A1* | 2/2011 | Frost | G06F 11/1068 |
| | | | 714/763 |
| 2011/0219259 A1* | 9/2011 | Frost | G06F 11/1469 |
| | | | 714/6.2 |
| 2012/0079167 A1* | 3/2012 | Yao | G06F 3/0659 |
| | | | 711/103 |
| 2012/0155167 A1* | 6/2012 | Uehara | G11C 11/5628 |
| | | | 365/185.03 |
| 2012/0166715 A1* | 6/2012 | Frost | G06F 3/0653 |
| | | | 711/103 |
| 2012/0191900 A1* | 7/2012 | Kunimatsu | G06F 3/0653 |
| | | | 711/103 |
| 2013/0128671 A1* | 5/2013 | Shin | G11C 16/06 |
| | | | 365/185.18 |
| 2013/0254458 A1* | 9/2013 | Pittelko | G06F 12/0246 |
| | | | 711/103 |
| 2013/0304966 A1* | 11/2013 | Joo | G06F 12/0246 |
| | | | 711/103 |
| 2014/0053041 A1* | 2/2014 | Sakaue | H03M 13/293 |
| | | | 714/758 |
| 2014/0059406 A1* | 2/2014 | Hyun | G11C 11/5621 |
| | | | 714/773 |
| 2014/0173207 A1* | 6/2014 | Wang | G06F 1/3243 |
| | | | 711/122 |
| 2014/0181532 A1* | 6/2014 | Camp | G06F 12/1408 |
| | | | 713/190 |
| 2014/0379968 A1* | 12/2014 | Yao | G06F 3/0659 |
| | | | 711/103 |
| 2015/0193302 A1* | 7/2015 | Hyun | G06F 11/108 |
| | | | 714/764 |
| 2016/0070336 A1* | 3/2016 | Kojima | G06F 12/0246 |
| | | | 711/103 |
| 2016/0162215 A1* | 6/2016 | Jayaraman | G06F 3/0688 |
| | | | 711/103 |
| 2016/0259589 A1 | 9/2016 | Zettsu et al. | |
| 2018/0039444 A1* | 2/2018 | Yamamoto | G06F 3/0616 |
| 2018/0059761 A1 | 3/2018 | An et al. | |
| 2018/0081594 A1 | 3/2018 | Jung et al. | |
| 2019/0065080 A1* | 2/2019 | Tanpairoj | G06F 3/061 |
| 2019/0065388 A1* | 2/2019 | Christensen | G06F 3/0679 |
| 2019/0095116 A1* | 3/2019 | Igahara | G06F 3/0619 |
| 2019/0198113 A1* | 6/2019 | Ben-Rubi | G06F 3/0656 |
| 2019/0198114 A1* | 6/2019 | Ben-Rubi | G06F 11/1068 |
| 2020/0409555 A1* | 12/2020 | Yao | G06F 3/0641 |

* cited by examiner

LBA range/write mode table

| LBA range | Write mode |
|---|---|
| Start LBA, End LBA | SLC |
| Start LBA, End LBA | TLC |
| Start LBA, End LBA | QLC |
| ⋮ | ⋮ |

|  | Data density | R/W speed | Endurance (P/E cycles) |
|---|---|---|---|
| QLC | 16 values (4 pages) | Slow ↕ Fast | Short (several k cycles) ↕ Long (several tens k cycles) |
| TLC | 8 values (3 pages) | | |
| MLC | 4 values (2 pages) | | |
| SLC | 2 values (1 page) | | |

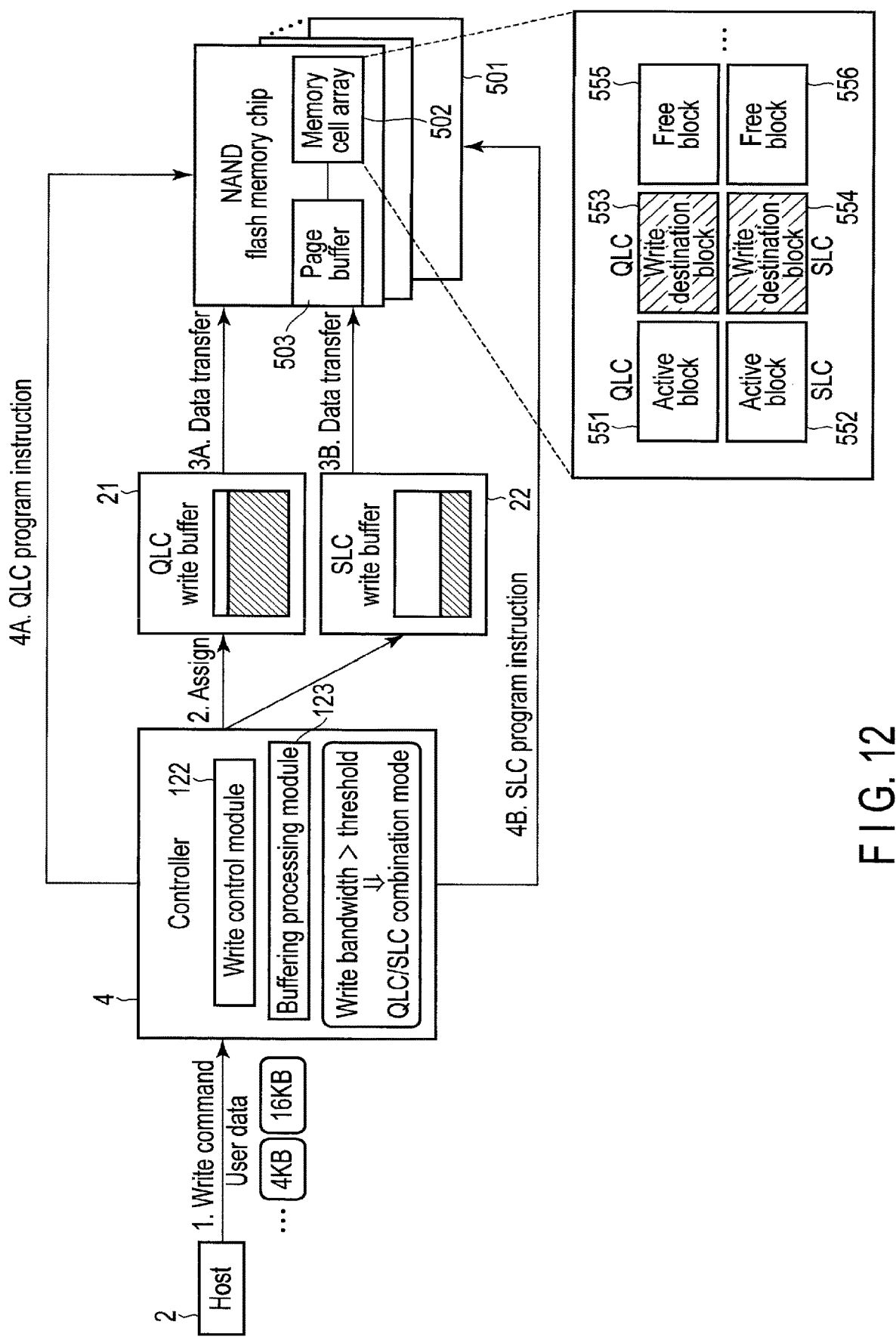
F I G. 12

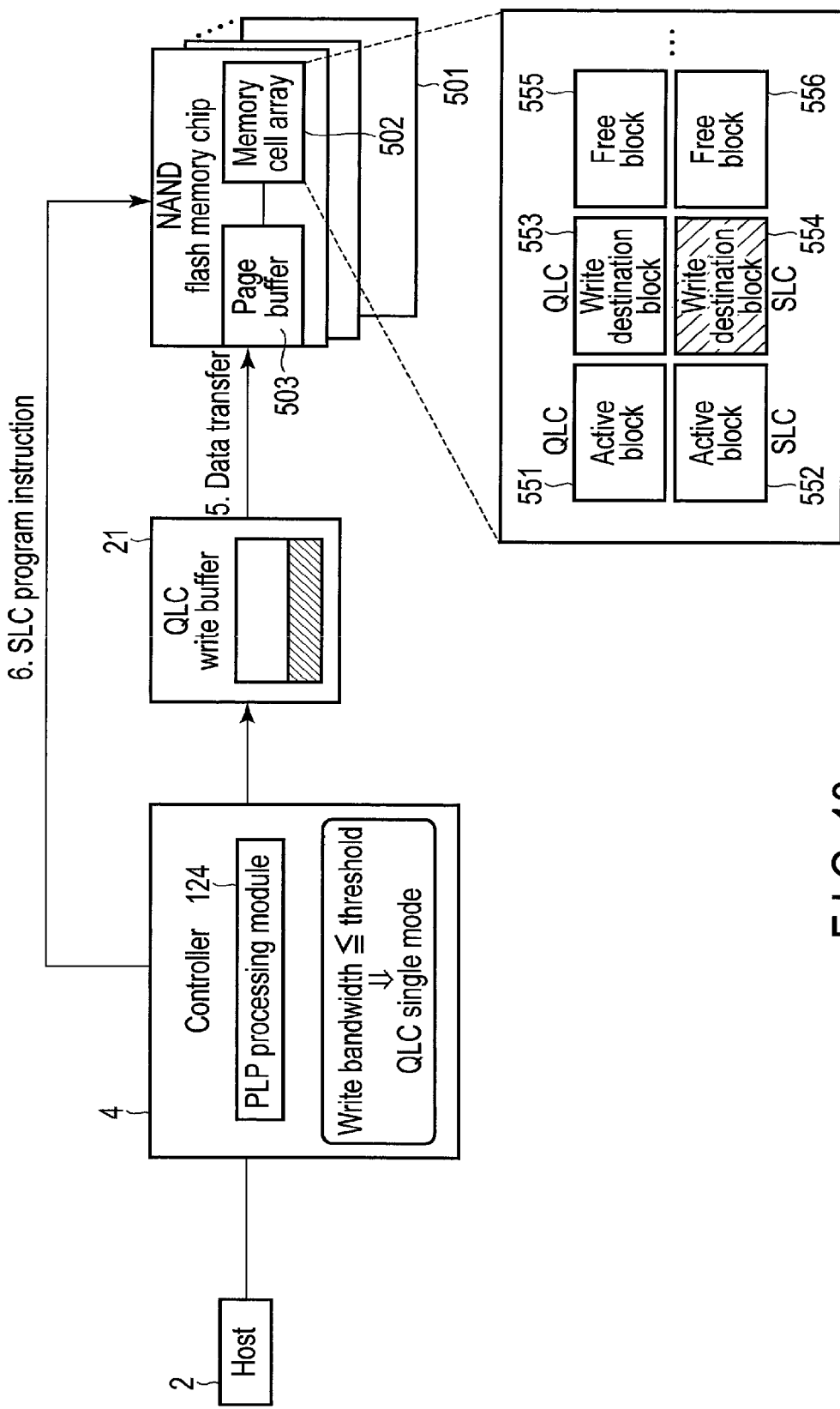
F I G. 13

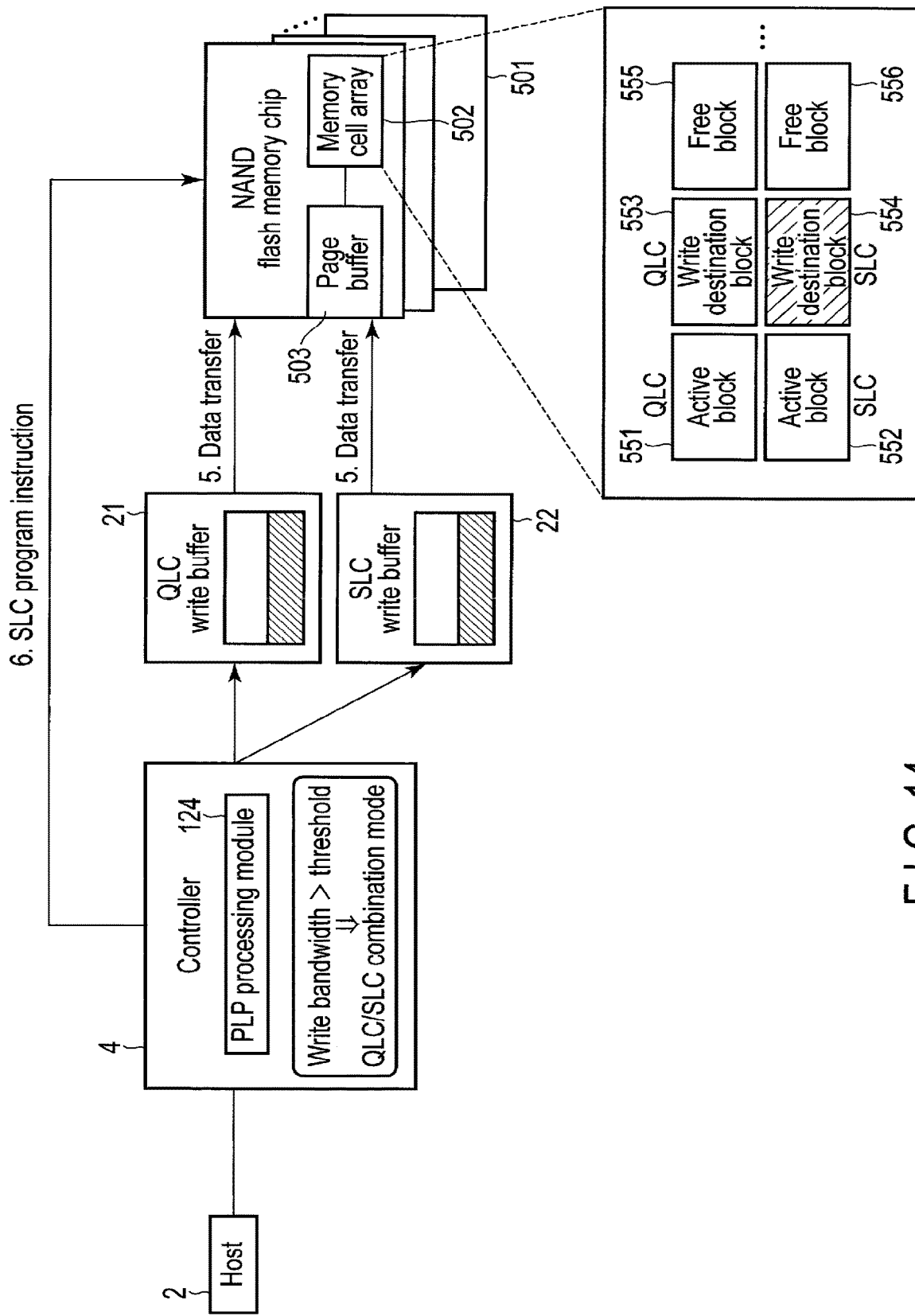
F I G. 14

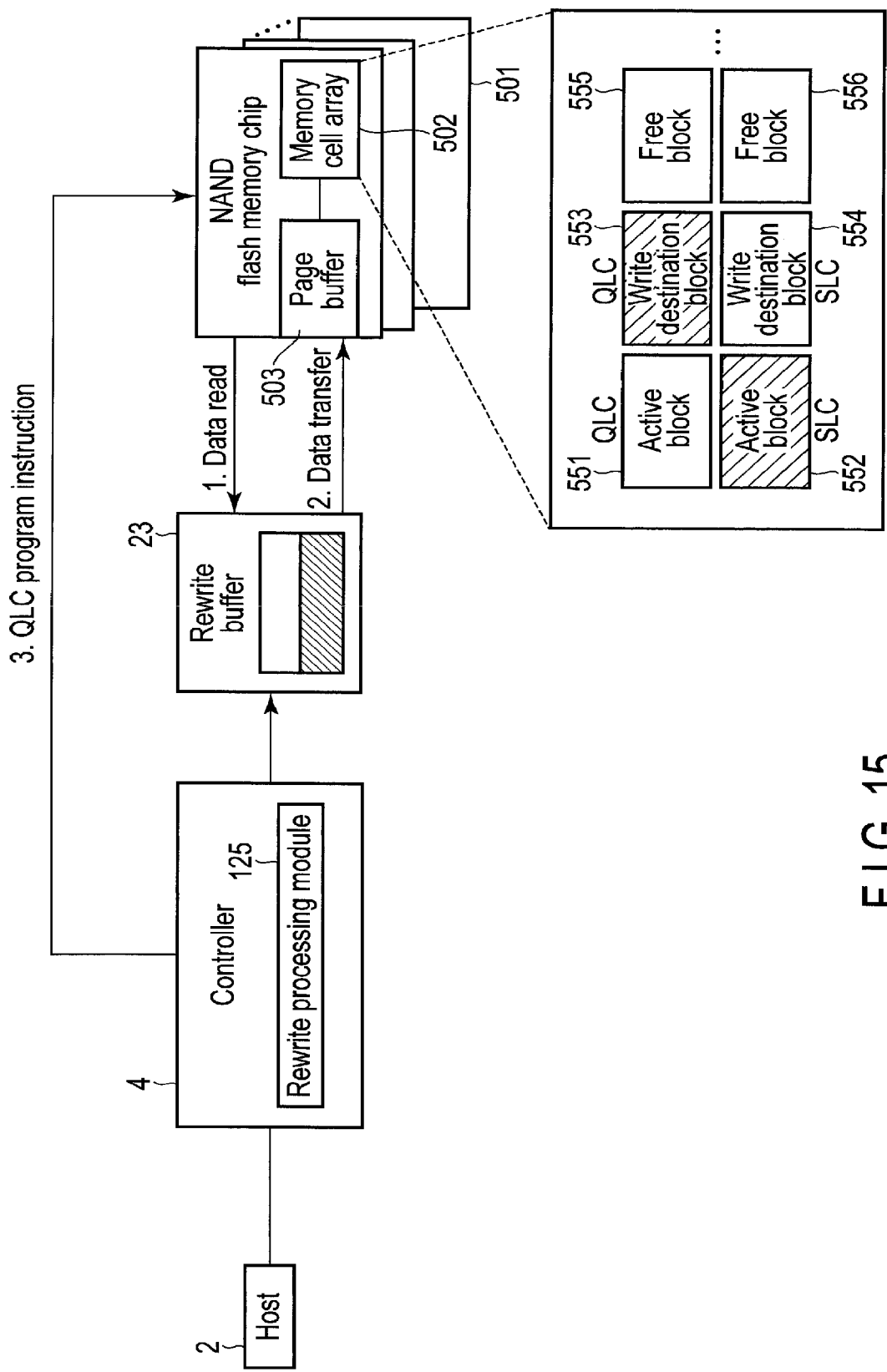
F I G. 15

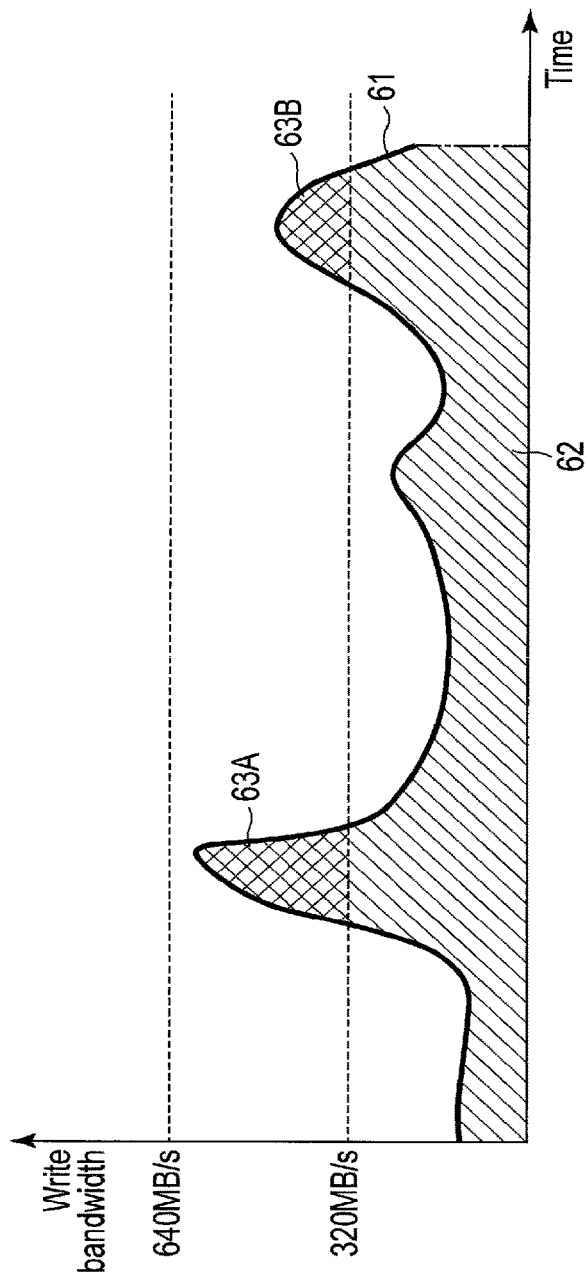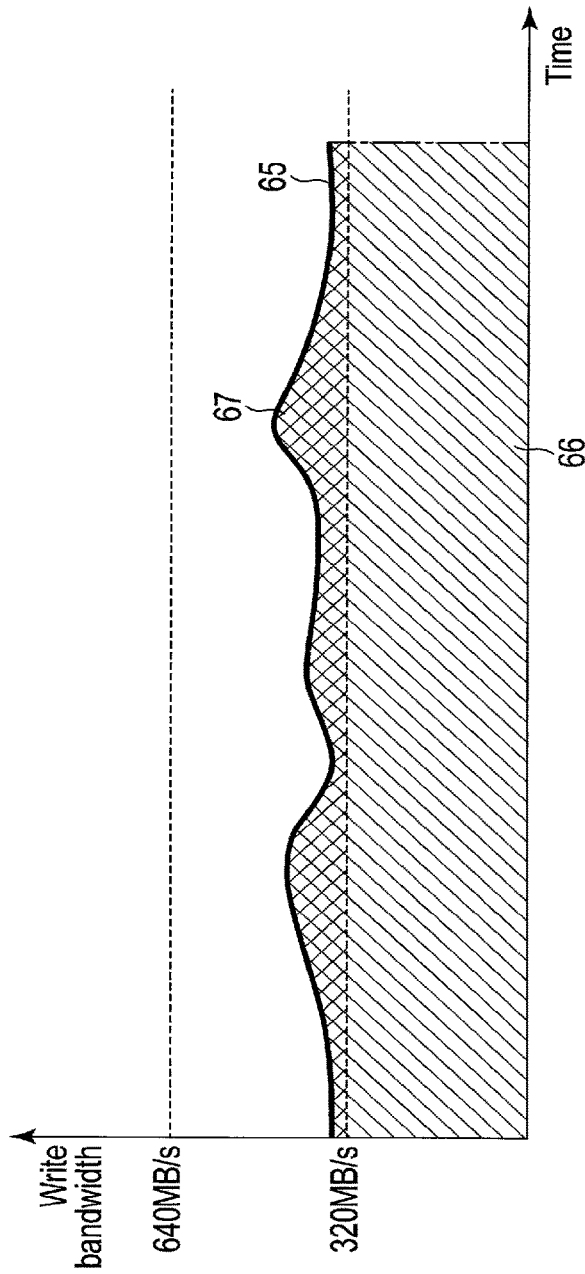
F I G. 16A
F I G. 16B

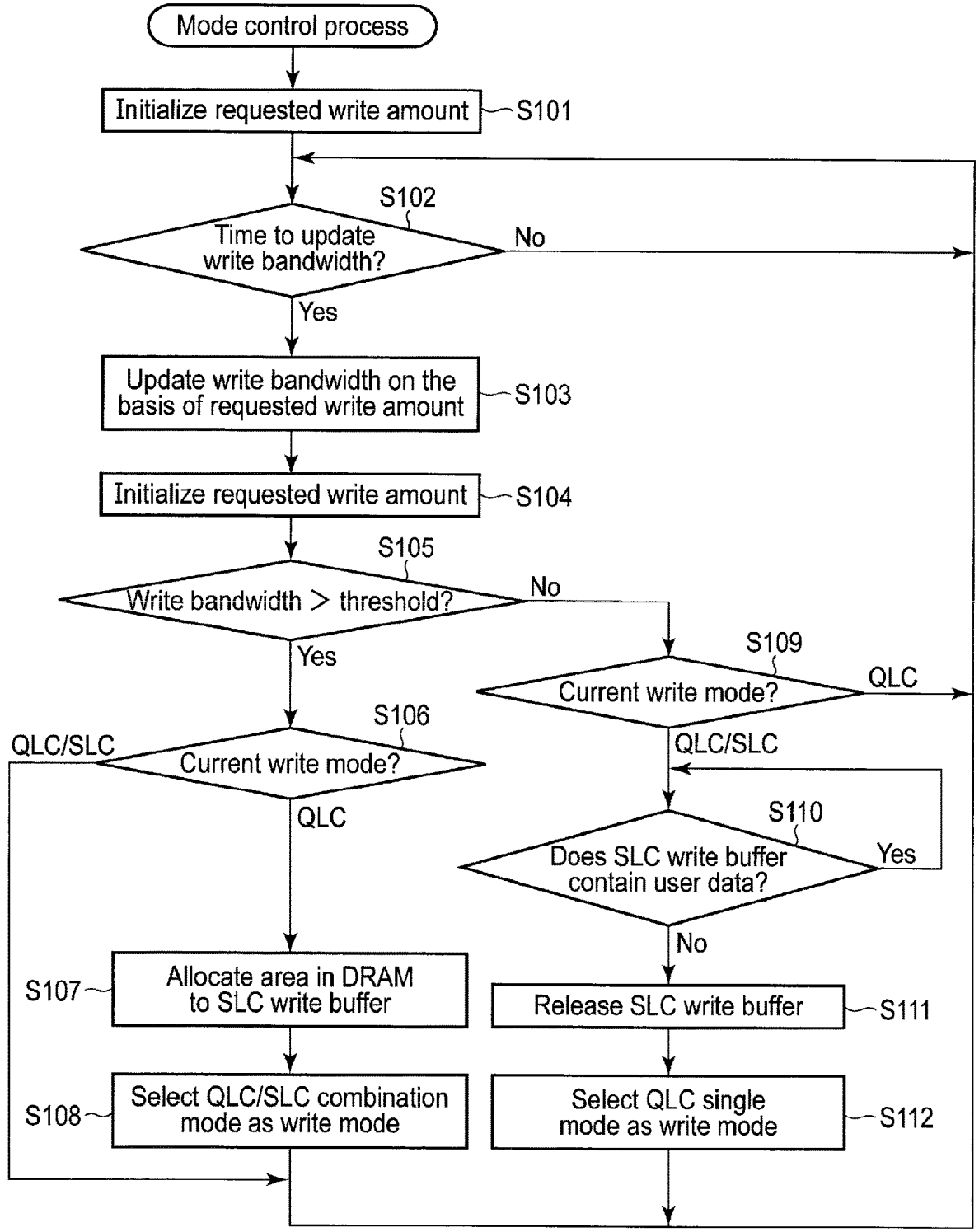
F I G. 17

MEMORY SYSTEM AND METHOD

CROSS-REFERENCE TO RELATED APPLICATIONS

This application is based upon and claims the benefit of priority from Japanese Patent Application No. 2018-160233, filed Aug. 29, 2018, the entire contents of which are incorporated herein by reference.

FIELD

Embodiments described herein relate generally to a memory system including a nonvolatile memory.

BACKGROUND

In recent years, memory systems including a nonvolatile memory are widely used.

As a type of the memory systems, a solid state drive (SSD) including a NAND flash memory is known. Compared with hard disk drives (HDD), SSDs are capable of high performance and have low power consumption, so the number of cases in which SSDs are used as main storages of various computing devices is increasing.

Since the tolerable maximum number of program/erase (P/E) cycles for a nonvolatile memory such as a NAND flash memory is limited, the nonvolatile memory might not be able to achieve a specified reliability when the P/E cycles exceed the limited number.

Furthermore, in a nonvolatile memory, when the number of bits stored in each memory cell (specifically, memory density) increases, a storage capacity increases, but a time required to write data in the nonvolatile memory and a time required to read data from the nonvolatile memory both become longer.

Recently, memory systems configured to write data in a nonvolatile memory by selectively using a single-level cell (SLC) mode to store one bit data in one memory cell and a multi-level cell (MLC) mode to store two or more bit data in one memory cell have been developed.

BRIEF DESCRIPTION OF THE DRAWINGS

FIG. 12 is a diagram showing an example in which user data is written into the NAND flash memory in QLC mode and SLC mode in the memory system of the embodiment when the write bandwidth exceeds the threshold.

FIG. 13 is a diagram illustrating an example in which user data in the QLC write buffer is written into the NAND flash memory in SLC mode in the memory system of FIG. 11 in response to a shutoff of a power supply from an external power source.

FIG. 14 is a diagram illustrating an example in which user data in the QLC write buffer and user data in the SLC write buffer are written into the NAND flash memory in SLC mode in the memory system of FIG. 12 in response to a shutoff of a power supply from the external power source.

FIG. 15 is a diagram illustrating an example in which user data, which is temporarily written in the NAND flash memory in SLC mode, is rewritten into the NAND flash memory in QLC mode in the memory system of the embodiment.

FIG. 16A is a diagram for explaining an example of a transition of the write bandwidth in which the memory system of the embodiment is feasible.

FIG. 16B is a diagram for explaining an example of a transition of the write bandwidth in which the memory system of the embodiment is not feasible.

FIG. 17 is a flowchart of an example of the procedure of a mode control process executed in the memory system of the embodiment.

DETAILED DESCRIPTION

Various embodiments will be described hereinafter with reference to the accompanying drawings.

In general, according to one embodiment, a memory system includes a nonvolatile memory, a random access memory and a controller. The random access memory is configured to store data that is received from a host in accordance with acceptance of a write command. The controller is electrically connected to the nonvolatile memory and the random access memory. The controller is configured to select, as a write mode, at least one of a first mode in which N-bit data is written per memory cell in the nonvolatile memory and a second mode in which M-bit data is written per memory cell in the nonvolatile memory as a write mode, N being equal to or larger than one, M being larger than N. The controller is configured to write data stored in the random access memory into the nonvolatile memory in the selected write mode. The controller is configured to select the second mode as the write mode when a reception speed of data, which is received in accordance with acceptance of one or more write commands from the host, is equal to or slower than a threshold. The controller is configured to select the first mode as the write mode when the reception speed is faster than the threshold.

Figure 1:
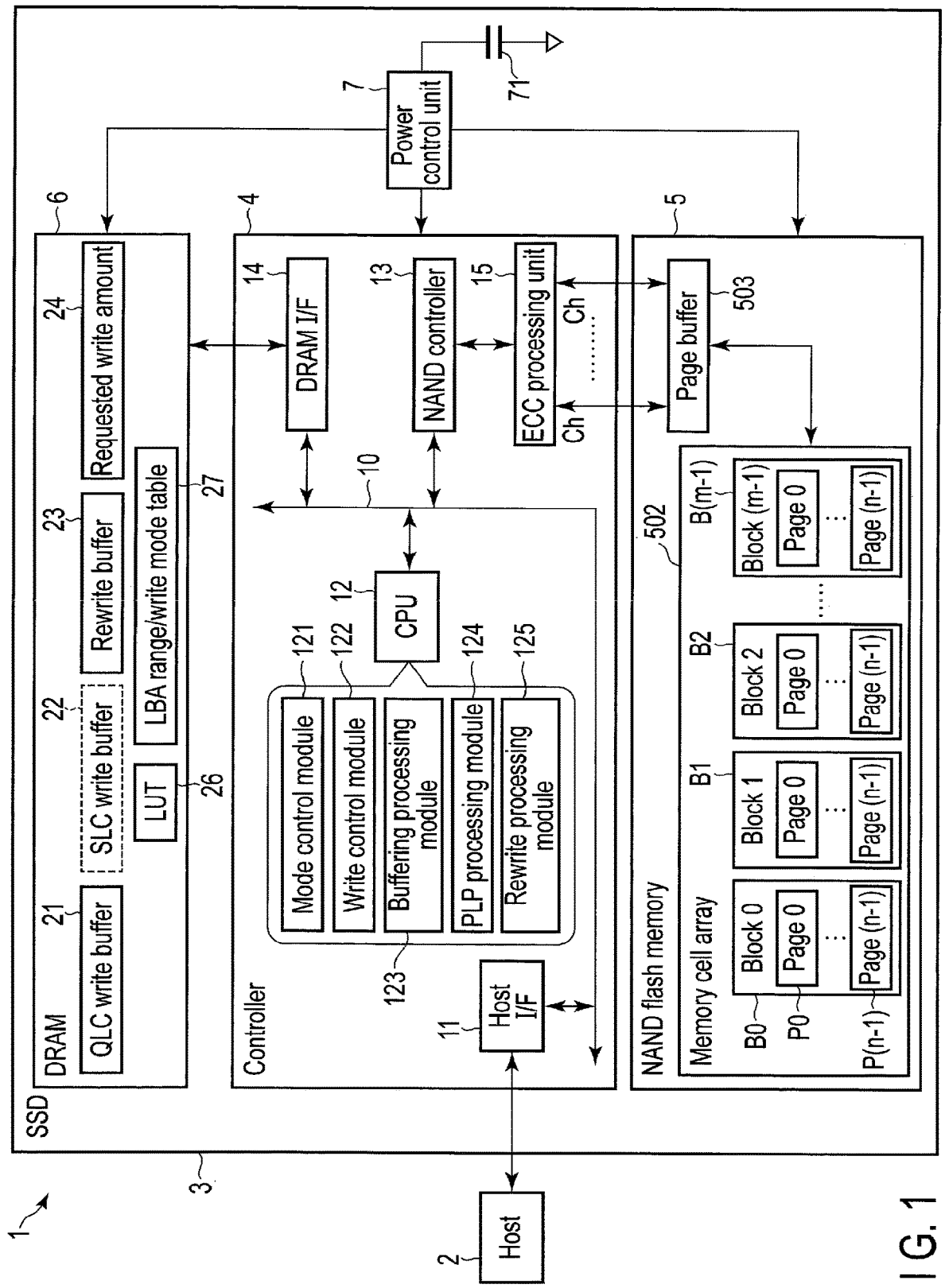
FIG. 1 is a block diagram illustrating an example of the structure of a memory system according to an embodiment.

With reference to FIG. 1, an information processing system 1 that includes a memory system of the present embodiment will be explained.

The memory system is a semiconductor storage device configured to write data into a nonvolatile memory such as a NAND flash memory 5 and read data from the nonvolatile memory. The memory system may be realized as a solid state drive (SSD) 3 that includes, for example, a NAND flash memory 5.

The information processing system 1 includes a host device 2 (also referred to as a host) and the SSD 3. The host 2 is an information processing apparatus which accesses the SSD 3. The host 2 may be a storage server which stores huge and various data in the SSD 3, or may be a personal computer.

The SSD 3 may be used as a main storage of the information processing apparatus functioning as the host 2. The SSD 3 may be contained in the information processing apparatus or may be connected to the information processing apparatus via a cable or a network.

As an interface to connect the host 2 with the SSD 3, SCSI, serial attached SCSI (SAS), ATA, serial ATA (SATA), PCI Express (PCIe) (registered trademark), Ethernet (registered trademark), Fibre channel, or NVM Express (NVMe) (registered trademark) may be used.

The SSD 3 includes a controller 4 and a NAND flash memory 5. The controller 4 may be realized with a circuit such as a system-on-a-chip (SoC).

The SSD 3 may include a random access memory (RAM) such as a dynamic random access memory (DRAM) 6 as a volatile memory. Alternatively, a RAM such as a static random access memory (SRAM) may be included in the controller 4. Note that the DRAM 6 may also be included in the controller 4.

The random access memory such as the DRAM 6 includes a buffer area for temporarily storing data to be written into the NAND flash memory 5 and data read from the NAND flash memory 5. This buffer area may be allocated as, for example, a QLC write buffer 21, an SLC write buffer 22, and a rewrite buffer 23. The QLC write buffer 21 is used for temporarily storing data to be written into the NAND flash memory 5 in a quad-level cell (QLC) mode. The SLC write buffer 22 is used for temporarily storing data to be written into the NAND flash memory 5 in a single-level cell (SLC) mode. The rewrite buffer 23 is used for temporarily storing data to be rewritten into the NAND flash memory 5 in a write mode that is different from a write mode in which the data is currently written.

Figures 2, 3, 4:
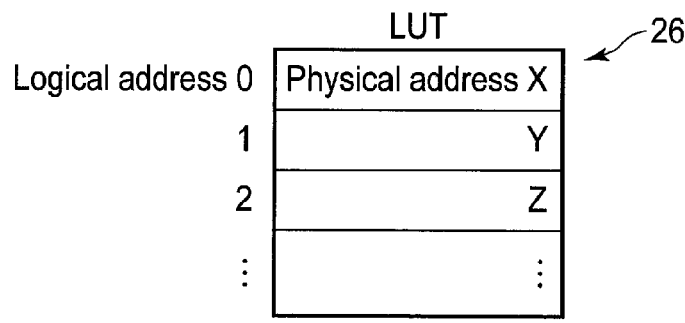
FIG. 2 illustrates an example of the structure of a lookup table (LUT) used in the memory system of the embodiment.
FIG. 3 illustrates an example of the structure of an LBA range/write mode table used in the memory system of the embodiment.
FIG. 4 illustrates characteristics of write modes used in the memory system of the embodiment.

The random access memory (DRAM) 6 includes a cache area of a lookup table (LUT) 26 functioning as a logical-to-physical address conversion table. As illustrated in FIG. 2, the LUT 26 manages mapping between each logical address (for example, a logical block address (LBA)) and each physical address of the NAND flash memory 5.

Further, the DRAM 6 may include areas for storing various information (for example, a requested write amount 24 and the like) and various tables (for example, an LBA range/write mode table 27) that are used for processing commands received from the host 2. As illustrated in FIG. 3, the LBA range/write mode table 27 manages a relationship between an LBA range and a corresponding write mode corresponding. Each LBA range may be defined by a start LBA and an end LBA, or may be defined by a start LBA and a size.

Return to FIG. 1. The SSD 3 further includes a power control unit 7. The power control unit 7 supplies power to each unit of the SSD 3. The power control unit 7 uses, for example, power supplied from an external power source (not shown) to the power control unit 7 to control the power supplied to each unit of the SSD 3. When the power supplied from the external power source is shut off, the power control unit 7 temporarily supplies power to each unit of the SSD 3 by using electric charge stored in a power storage device 71. The power storage device 71 may be a capacitor, a battery, or the like.

The power storage device 71 functions as a backup power source when the power supplied from the external power source is shut off. For example, the power storage device 71 stores electric charge, which is required for the SSD 3 to execute a power loss protection (PLP) function, while power is being supplied from the external power source. The PLP function is a function for writing, when the power supplied from the external power source to the SSD 3 is shut off, user data and the like into the NAND flash memory 5 using energy of the electric charge stored in the power storage device 71. This user data and the like is data that has been stored in the DRAM 6 and has not yet been written into the NAND flash memory 5.

The NAND flash memory 5 may include NAND flash memory chips (NAND flash memory dies). Each chip may be realized as a flash memory configured to store multiple bits per memory cell.

As a flash memory configured to store multiple bits per memory cell, a multi-level cell (MLC or 4LC) flash memory configured to store 2-bit data per memory cell, a triple-level cell (TLC or 8LC) flash memory configured to store 3-bit data per memory cell, and a quad-level cell (QLC or 16LC) flash memory configured to store 4-bit data per memory cell may be used, for example. Note that a flash memory storing multiple bits data per memory cell may be generally referred to as the MLC flash memory in some cases. In the following, a flash memory that stores 2-bit data per memory cell is referred to as the MLC flash memory.

The NAND flash memory 5 includes a memory cell array 502 including memory cells arranged in an array. The NAND flash memory 5 may be a two-dimensional structure NAND flash memory or a three-dimensional NAND flash memory.

The NAND flash memory 5 includes a page buffer 503 for temporarily storing user data to be written that has been transferred from the controller 4. For example, when the controller stores the user data in the page buffer 503 and instructs the NAND flash memory 5 to program, the NAND flash memory 5 writes the user data into the memory cell array 502. That is, the NAND flash memory 5 receives the user data to be written from the controller 4 via the page buffer 503.

The memory cell array 502 of the NAND flash memory 5 includes blocks B0 to B(m−1). Each of the blocks B0 to B(m−1) includes pages (here, pages P0 to P(n−1)). The blocks B0 to B(m−1) each function as a minimum erase unit. A block may be referred to as an erase block or a physical block. Each of the pages P0 to P(n−1) includes memory cells connected to a single word line. The pages P0 to P(n−1) each function as a unit of a data write operation and a data read operation. Note that a word line may be used as a unit of a data write operation and a data read operation.

The tolerable maximum number of P/E cycles for each of the blocks B0 to B(m−1) is limited. One P/E cycle of a block includes an erase operation to erase data stored in all memory cells in the block and a write operation (specifically, a program operation) to write data in each page of the block.

The NAND flash memory 5 may execute a write operation in an SLC mode in which one bit is written per memory cell, in an MLC mode in which two bits are written per memory cell, in a TLC mode in which three bits are written per memory cell, or in a QLC mode in which four bits are written per memory cell.

For example, the NAND flash memory 5 may be an MLC flash memory configured to store two bits per memory cell (4LC flash memory).

In that case, generally, two-page data (lower page data and upper page data) is written in memory cells connected to a single word line. Thus, two bits are written per memory cell. Any area in the MLC flash memory (for example, any one or more blocks) may be used as an SLC area configured to store only one bit per memory cell.

In a write operation to write data in the SLC area, only data of one page is written in memory cells connected to a single word line. Thus, in each block used as the SLC area, only one bit is written per memory cell as in each block of an SLC flash memory (that is, SLC block). As a result, each block used as the SLC area functions as an SLC block.

Alternatively, the NAND flash memory. 5 may be a TLC flash memory configured to store three bits per memory cell (8LC flash memory).

In that case, generally, three-page data (lower page data, middle page data, and upper page data) is written in memory cells connected to a single word line. Thus, three bits are written per memory cell. Any area in the TLC flash memory (for example, any one or more blocks) may be used as the above-described SLC area, or an MLC area configured to store two bits per memory cell. Note that the SLC area and the MLC area may be defined by a unit smaller than a block (for example, a unit of a word line, a unit of word lines in a block). In the MLC area, only data of two pages is written in memory cells connected to a single word line. Thus, in the MLC area, only two bits are written per memory cell.

Alternatively, the NAND flash memory 5 may be a QLC flash memory configured to store four bits per memory cell (16LC flash memory).

In that case, generally, four-page data is written in memory cells connected to a single word line. Thus, four bits are written per memory cell. Any area (for example, any one or more blocks) in the QLC flash memory may be used as the above-described SLC area, or may be used as the above-described MLC area, or may be used as a TLC area configured to store three bits per memory cell. Note that each of the SLC area, the MLC area, and the TLC area may be defined by a unit smaller than a block (for example, a unit of a word line, a unit of word lines in a block). In the TLC area, only data of three pages is written in memory cells connected to a single word line. Thus, in the TLC area, only three bits are written per memory cell.

As illustrated in FIG. 4, data density per memory cell in each write mode is two values (that is, one page per word line) in the SLC mode, four values (that is, two pages per word line) in the MLC mode, eight values (that is, three pages per word line) in the TLC mode, and sixteen values (that is, four pages per word line) in the QLC mode. Here, data read speed and data write speed of the NAND flash memory 5 become slow when the data density is high and become fast when the data density is low. Thus, in these four modes, data read and write speed are slowest in the QLC mode and are fastest in the SLC mode.

Furthermore, an endurance of the NAND flash memory 5 becomes lower when the data density thereof is higher and becomes higher when the data density thereof is lower. A relationship between the endurance and the data density will be described focusing on a threshold voltage distribution of memory cells. Margins in the threshold voltage distribution are wider when the data density is lower and margins in the threshold voltage distribution are narrower when the data density is higher. A wide margin can suppress, even when a threshold voltage of a memory cell is shifted by a stress applied to the memory cell, a possibility that the data of the memory cell is read as incorrect data.

Thus, acceptable stress on individual memory cell in the SLC mode is greater than acceptable stress on individual memory cell in the QLC mode. As a result, when a write mode of low data density which can achieve a wide margin in the threshold distribution is used, an endurance (that is, tolerable maximum number of P/E cycles) of the NAND flash memory 5 is extended as compared to a case where a write mode of high data density which results in a narrow margin in the threshold voltage distribution.

Thus, in these four modes shown in FIG. 4, an endurance is lowest in the QLC mode and an endurance is highest in the SLC mode. For example, the tolerable maximum number of P/E cycles when data is written in the QLC mode is several k (thousand) cycles and the tolerable maximum number of P/E cycles when data is written in the SLC mode is several tens k cycles.

Note that the NAND flash memory 5 may be configured to store five or more bits per memory cell. In that case, any area in the NAND flash memory 5 may be used as an area in which data of four or less bits are written per memory cell.

Figure 5:
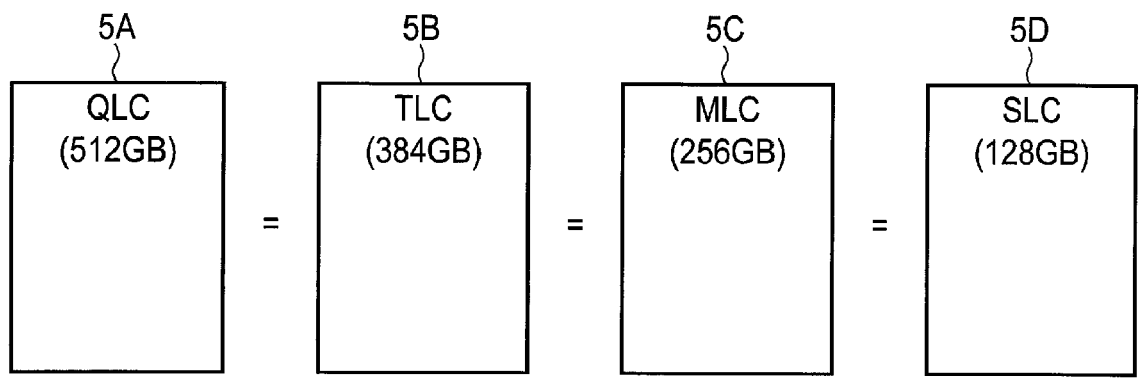
FIG. 5 illustrates an example of storage capacities of a NAND flash memory corresponding to the write modes of FIG. 4.

FIG. 5 illustrates an example of storage capacities of the NAND flash memory 5 corresponding to the write modes. Here, in this example, NAND flash memory chips included in the NAND flash memory 5 are realized as QLC flash memories configured to store four bits per memory cell. Furthermore, it is assumed that the storage capacity of the SSD 3 is 512 GB when data is written in the NAND flash memory 5 in the QLC mode.

As illustrated in FIG. 5, in an ideal state where there is no defective block, the storage capacity of the SSD 3 is 384 GB when data is written in the NAND flash memory 5 in the TLC mode, is 256 GB when data is written in the NAND flash memory 5 in the MLC mode, and is 128 GB when data is written in the NAND flash memory 5 in the SLC mode.

As described above, the storage capacity of the NAND flash memory 5 varies depending on the write modes, and hence, the storage capacity of the SSD 3 varies.

Refer back to FIG. 1. The controller 4 is electrically connected to the NAND flash memory 5 through a NAND controller 13 and an ECC processing unit 15. The NAND controller 13 includes a NAND interface conforming to an interface standard such as a Toggle DDR or an open NAND flash interface (ONFI). The NAND controller 13 functions as a NAND control circuit configured to control the NAND flash memory 5.

The NAND controller 13 and the ECC processing unit 15 may be connected to NAND flash memory chips in the NAND flash memory 5 via multiple channels (Ch). By driving the NAND flash memory chips in parallel, it is possible to broaden an access bandwidth to the NAND flash memory 5.

The ECC processing unit 15 may be realized as a circuit having a function of protecting each of data written into the NAND flash memory 5 and data read from the NAND flash memory 5 with an error correction code (ECC). The ECC processing unit 15 adds an ECC to data to be written into the NAND flash memory 5. The ECC processing unit 15 determines whether an error has occurred in data read from the NAND flash memory 5 by using the ECC added to the data, and corrects this error when the error occurs.

The controller 4 functions as a memory controller configured to control the NAND flash memory 5.

The controller 4 may function as a flash translation layer (FTL) configured to execute data management and block management of the NAND flash memory 5. The data management executed by the FTL includes (1) management of mapping data indicative of relationship between each logical address and each physical address of the NAND flash memory 5, (2) process for read/write operations of each page, and the like. The logical address is an address used by the host 2 for addressing the SSD 3. As a logical address, for example, a logical block address (LBA) may be used.

The management of mapping between each logical block address (LBA) and each physical address may be executed by using an LUT 26 functioning as a logical/physical address conversion table. The controller 4 manages mapping between each LBA and each physical address with a certain management size unit by using the LUT 26. A physical address corresponding to an LBA indicates a physical memory location in the NAND flash memory 5 to which data of the LBA is written. The LUT 26 may be loaded to the DRAM 6 from the NAND flash memory 5 when the SSD 3 is powered on.

Data write into one page is executable only once in a single P/E cycle. Thus, the controller 4 writes update data corresponding to an LBA not to an original physical memory location in which previous data corresponding to the LBA is stored but to a different physical memory location. Then, the controller 4 updates the LUT 26 to associate the LBA with the different physical memory location and to invalidate the previous data.

Hereinafter, data referred in the LUT 26 (that is, data associated with an LBA) will be referred to as valid data. Furthermore, data not associated with any LBA will be referred to as invalid data. The valid data is data to possibly be read by the host 2 later. The invalid data is data not to be read by the host 2 anymore.

The block management includes, for example, management of defective blocks, wear leveling, and garbage collection.

The controller 4 may include a host interface 11, a CPU 12, the NAND controller 13, a DRAM interface 14, the ECC process unit 15, and the like. The host interface 11, the CPU 12, the NAND controller 13, the DRAM interface 14, and the ECC process unit 15 may be mutually connected through a bus 10.

The host interface 11 functions as a circuit that receives various commands such as I/O commands, various control commands and the like from the host 2. The I/O commands may include a write command, a read command, and the like. The control commands may include an unmap command (trim command), a format command, a flush command, and the like. The format command is a command for unmapping all the logical addresses in the SSD 3 entirely. The flush command is a command for writing dirty data (for example, user data and related management data) that is cached or buffered inside the SSD 3, to the NAND flash memory 5.

The DRAM interface 14 functions as a DRAM controller configured to control accesses to the DRAM 6. The storage area of the DRAM 6 is allocated to areas for storing the requested write amount 24, the LUT 26, the LBA range/write mode table 27 and the like, and areas for use as the QLC write buffer 21, the SLC write buffer 22, and the rewrite buffer 23. The LBA range/write mode table 27 is a table used for managing a relationship between an LBA range and a corresponding write mode.

The CPU 12 is a processor configured to control the host interface 11, the NAND controller 13, and the DRAM interface 14. The CPU 12 performs various processes by executing control programs (e.g., firmware) stored in a ROM or the like which is not shown. The CPU 12 may perform, in addition to the above-described processes of FTL, command processes to process various commands from the host 2. The operation of the CPU 12 is controlled by the above-described firmware executed by the CPU 12. Note that part of or the entire FTL processes and the command processes may be executed by a dedicated hardware in the controller 4.

As described above, in the SSD 3, a RAM such as the DRAM 6 is used as a buffer. Since the SSD 3 transmits a response to the host when user data to be written, which is received from the host 2 in accordance with acceptance of a write command from the host 2, is stored in the DRAM 6 before the user data is written into the NAND flash memory 5, a response time is shortened.

At the time of this response, an operation to write the user data into the NAND flash memory 5 has not been completed. Therefore, when the power supplied to the SSD 3 is shut off, the user data stored in the DRAM 6, which is a volatile memory, is lost.

Accordingly, in order to maintain data consistency in the information processing system 1 including the host 2 and the SSD 3, the SSD 3 may have the PLP function. When power supplied from the external power source to the SSD 3 is shut off, the SSD 3 having the PLP function writes into the NAND flash memory 5 user data, which is stored in the DRAM 6 and which has not yet been written into the NAND flash memory 5, using energy of the electric charge stored in the power storage device 71 provided in the SSD 3.

One of the features that supports the growth of SSDs in the market is an increase in storage capacity per device. The increase in the storage capacity per device is largely due to the improvement in the packaging density of a NAND flash memory. The improvement in the packaging density of a NAND flash memory is achieved by storing multiple bits per memory cell as well as finer memory cells.

The multi-bit per memory cell has progressed from SLC storing 1-bit data in one memory cell to MLC storing 2-bit data and TLC storing 3-bit data. Recently, QLC that stores 4-bit data is being put into practical use.

In memory cells each storing multi-bit data, disturbs between memory cells might occur. In order to mitigate such disturbs between memory cells, processing such as inputting the same data multiple times to a memory cell may be necessary. Accordingly, it is necessary to store a large amount of data in a write buffer (for example, the DRAM 6) until writing the data into the NAND flash memory 5 is completed.

Here, a relationship between a size of a write buffer and the PLP function will be described. As a result of recent progress of multi-bit memory cells as described above, the size of a required write buffer is increasing. Further, as a reception speed (hereinafter also referred to as a write bandwidth) of user data to be written that is received by the controller 4 from the host 2 gets higher, it is necessary to drive NAND flash memory chips in parallel to increase a write speed at which the controller 4 writes the user data into the NANb flash memory 5. Therefore, the size of the write buffer increases in proportion to the increase in the write bandwidth. The host 2 causes the controller 4 to receive the user data to be written with a certain write bandwidth, and as a result, requires the controller 4 to write the user data into the NAND flash memory 5 at the write speed corresponding to this write bandwidth. In other words, it can be said that the required write speed to the NAND flash memory 5 is determined according to the write bandwidth.

In consideration of the above, the size of the write buffer corresponding to the maximum amount of data that is required to be written by a PLP operation is increasing. Furthermore, the amount of electric charge that can be stored in the power storage device 71 for the PLP operation is limited.

When power supplied from the external power source to the SSD 3 is shut off, the user data stored in the write buffer is written into, for example, a dedicated area in the NAND flash memory 5 in the SLC mode by the PLP operation. Since the write operation in SLC mode is performed at high speed, that is, a write operation in a short time is possible compared with the cases of the MLC mode, the TLC mode, and the QLC mode, the amount of electric charge consumed in the write operation is small.

A method of reducing the amount of data that is stored in the write buffer (hereinafter also referred to as a buffer amount) and is to be written by the PLP operation includes, for example, a method in which the user data received from the host 2 is temporarily written into the NAND flash memory 5 in the SLC mode, and the written user data is rewritten into the NAND flash memory 5 in the QLC mode (or the TLC mode or the MLC mode) at the time of idling.

In this method, since the time required for a write operation (that is, a data input operation and a program operation) in the SLC mode for the NAND flash memory 5 is short, the number of write operations performed in parallel (that is, the number of memory chips into which data is written in parallel) is small to achieve the write bandwidth. The size of the write buffer required is in proportion to the number of write operations performed in parallel. Consequently, in this method, the buffer amount required for achieving the write bandwidth decreases. Therefore, the amount of electric charge required for the PLP operation is also small.

However, with this method, the problem occurs in write tolerance of SLC blocks in which data is written in the SLC mode. That is, the number of P/E cycles of each of the SLC blocks may exceed the maximum number of P/E cycles of a SLC block.

For example, consider that the entire storage capacity of the NAND flash memory 5 is composed of the storage capacity of QLC blocks in which data is written in the QLC mode (hereinafter also referred to as the QLC storage capacity) and the storage capacity of SLC blocks in which data is written in the SLC mode (hereinafter also referred to as SLC storage capacity). In this case, if the SLC storage capacity is configured to be 1% of the QLC storage capacity, the maximum number of P/E cycles of each QLC block is 10,000, and the maximum number of P/E cycles of each SLC block is 100,000, all write amount of data to the QLC blocks is to be written via the SLC blocks that have the storage capacity equal to 1% of the QLC storage capacity. Therefore, 1,000,000 (=10,000/0.01) write operations are performed on each SLC block, which exceeds the maximum number of P/E cycles of the SLC block. As described above, one P/E cycle of a certain block includes an erase operation in which all the memory cells in this block are put into an erase state, and a write operation in which data is written into each page of this block. In the present embodiment, in order to make the explanation easier to understand, X P/E cycles may be referred to as X write operations in some cases.

In order that the number of write operations (that is, the number of P/E cycles) via the SLC blocks is less than the maximum number of P/E cycles, it is necessary to configure the NAND flash memory 5 so that the SLC storage capacity has 10% of the QLC storage capacity. In this case, 100,000 (=10,000/0.1) write operations are performed in each SLC block, which is less than the maximum number of P/E cycles of the SLC block.

However, configuring the NAND flash memory 5 so that 10% of the QLC storage capacity equals the SLC storage capacity will impair the economic efficiency of the NAND flash memory 5 from the viewpoint of storage capacity. That is, in the above method, the economic efficiency of the NAND flash memory 5 is impaired in exchange for the write tolerance of the SLC blocks.

Therefore, in the present embodiment, the write mode is selected according to the write bandwidth that determines a write speed requested from the host 2 to the SSD 3. The write bandwidth is, for example, a reception speed of user data to be written, which is received from the host 2 in accordance with acceptance of a write command received from the host 2. More specifically, when the write bandwidth is equal to or lower than a threshold, the user data received from the host 2 in accordance with acceptance of a write command is written into the NAND flash memory 5 in a second mode. When the write bandwidth exceeds the threshold, the user data is written in a first mode or the second mode. N-bit data per memory cell is written in the first mode and M-bit data per memory cell is written in the second mode. Here, N is equal to or larger than one and M is larger than N. For example, the first mode is the SLC mode and the second mode is the QLC mode, the TLC mode, or the MLC mode.

When the write bandwidth is equal to or lower than the threshold, user data to be written in the second mode is stored in a second write buffer (for example, the QLC write buffer 21), and the user data stored in the second write buffer is written to the NAND flash memory 5 in the second mode.

Further, in response to the write bandwidth exceeding the threshold, a storage area in the DRAM 6 is further allocated to a first write buffer (for example, the SLC write buffer 22) in which user data to be written in the first mode is stored. When the write bandwidth exceeds the threshold, the user data stored in the first write buffer is written into the NAND flash memory 5 in the first mode, and the user data stored in the second write buffer is written into the NAND flash memory 5 in the second mode.

With such a configuration, user data is not written into the first mode (for example, SLC mode) when the write bandwidth is equal to or lower than the threshold, and user data is written into the first mode when the write bandwidth exceeds the threshold. Accordingly, it is possible to reduce the storage capacity required as blocks in which user data is written in the first mode even if the maximum number of P/E cycles (that is, write tolerance) of the block in which data is written in the first mode is taken into consideration. Therefore, the entire storage capacity of the NAND flash memory 5 can be efficiently used, and economic efficiency can be enhanced.

From the above, it can be said that the first mode is a performance priority write mode for improving the write performance and the read performance of the SSD 3 by reducing the number of stored bits per memory cell. On the other hand, it can be said that the second mode is a capacity priority write mode for increasing the storage capacity by increasing the number of stored bits per memory cell.

Figure 6:
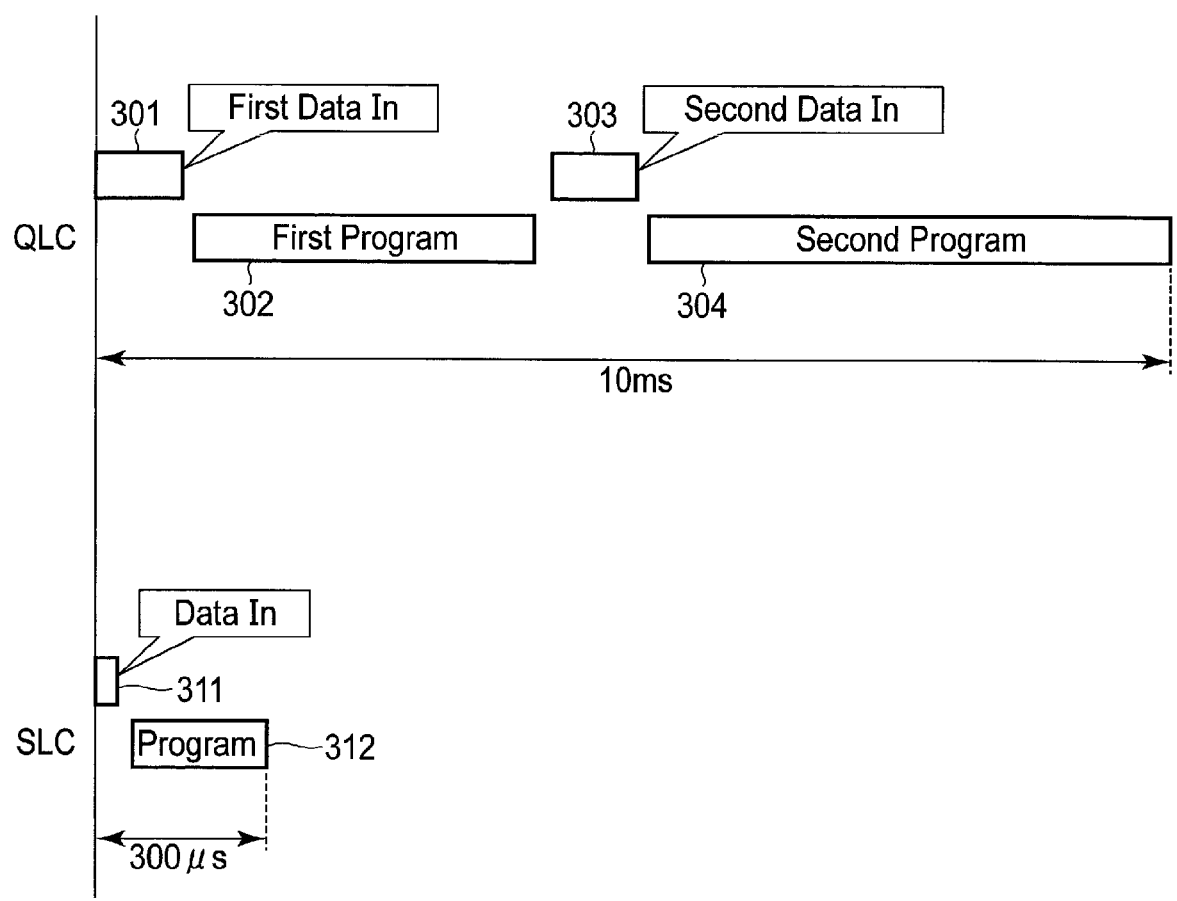
FIG. 6 is a diagram illustrating an example of time required when data is written in QLC mode and an example of time required when data is written in SLC mode by the memory system of the embodiment.

With reference to FIG. 6, the difference in write performance between the first mode and the second mode will be described. Here, the case where the first mode is the SLC mode and the second mode is the QLC mode will be exemplified.

In a write operation in the QLC mode, data of four pages is stored in the page buffer 503 in the NAND flash memory chip in a first data-in operation 301. That is, when the data size per page is 16 KB, 64-KB data is stored in the page buffer 503 in the NAND flash memory chip. Then, a first program operation 302 for programming the data of four pages stored in the page buffer 503 into the memory cell array 502 in the NAND flash memory chip is performed.

Similarly, data of four pages is stored in the page buffer 503 in the NAND flash memory chip in a second data-in operation 303. The data stored in the second data-in operation 303 is the same as the data stored in the first data-in operation 301. Then, a second program operation 304 for programming the data of four pages stored in the page buffer 503 into the memory cell array 502 in the NAND flash memory chip is performed.

Thus, the time required for one write operation in the QLC mode includes the time required for two data-in operations 301, 303 and the time required for two program operations 302, 304. Here, it is assumed that the time required for one write operation in the QLC mode is 10 milliseconds (ms). According to this assumption, since 64-KB data is written in 10 ms, the write speed of the SSD 3 in the QLC mode is said to be 6.4 MB/s (=64 KB/10 ms).

The write buffer in the DRAM 6 needs to store data from the beginning of the first data-in operation 301 to the completion of the second program operation 304. Therefore, in order to achieve the write speed of 6.4 MB/s, it is necessary to allocate the 64-KB area in the DRAM 6 as a write buffer.

In the SSD 3, in to the case of achieving a write speed of 640 MB/s by write operations only in the QLC mode, it is necessary to drive 100 (=640/6.4) NAND flash memory chips in parallel. For that purpose, it is necessary to allocate an area of 6.4 MB (=64 KB×100) in the DRAM 6 as a write buffer.

On the other hand, in one write operation in the SLC mode, data of one page is stored in the page buffer 503 in the NAND flash memory chip in a data-in operation 311. Then, a program operation 312 for programming the data of one page stored in the page buffer 503 into the memory cell array 502 in the NAND flash memory chip is performed.

Therefore, the time required for one write operation in the SLC mode includes the time required for one data-in operation 311 and the time required for one program operation 312. Here, it is assumed that the time required for one write operation in the SLC mode is 300 microseconds (μs). According to this assumption, since 16-KB data is written in 300 μs, the write speed of the SSD 3 in the SLC mode is said to be 53 MB/s (=16 KB/300 μs).

In the SSD 3, in the case of achieving the write speed of 640 MB/s by write operations only in the SLC mode, it is necessary to drive 12 (=640/53) NAND flash memory chips in parallel. For that purpose, it is necessary to allocate an area of 192 KB (=16 KB×12) in the DRAM 6 as a write buffer.

As in the above example, a write operation in the QLC mode, the TLC mode, or the MLC mode has a slower write speed than a write operation in the SLC mode. Therefore, in order to satisfy the write bandwidth requested by the host 2 in the QLC mode, the TLC mode, or the MLC mode, it is necessary to drive a large number of NAND flash memory chips in parallel and a storage capacity in the DRAM 6 allocated as the write buffer also increases.

When power supplied from the external power source to the SSD 3 is shut off, since a storage area in the DRAM 6 is allocated to the write buffer, user data stored in the write buffer is lost. Also, the SSD 3 responds to the host 2 when user data is written into the write buffer (that is, the DRAM 6). Therefore, in order to maintain the consistency of the data between the SSD 3 and the host 2, while the power supply is maintained by the electric charge stored in the power storage device 71, the PLP operation to write the user data remaining in the write buffer into the NAND flash memory 5 is performed. For the PLP operation, the SLC mode with high speed and low power consumption may be used.

In the above example, it is illustrated that a 6.4-MB write buffer is required to achieve a write bandwidth of 640 MB/s by write operations only in the QLC mode. Since the capacity of the power storage device 71 that stores electric charge for the PLP operation is limited, it might be impossible to complete the process for writing 6.4 MB of data, which may be stored in the write buffer, into the NAND flash memory 5 while the power supply is maintained by the electric charge supplied from the power storage device 71.

Methods of reducing the size of the write buffer may include (A) a method of lowering the write bandwidth, and (B) a method of writing user data received from the host 2 temporarily into the NAND flash memory 5 in the SLC mode, and re-writing the user data into the NAND flash memory 5 in the QLC mode (or the TLC mode or the MLC mode) at the time of idling.

In the method (A), as the write bandwidth decreases, the capacity of the write buffer decreases, but the write bandwidth requested by the host 2 cannot be satisfied.

In the method (B), the required write buffer capacity is reduced to 192 KB, but blocks used for write operations in the SLC mode may reach the maximum number of P/E cycles for the SLC mode, and a failure may occur.

An example of the SSD 3 to which the method (B) is applied will be specifically described with reference to FIGS. 7 and 8.

Figure 7:
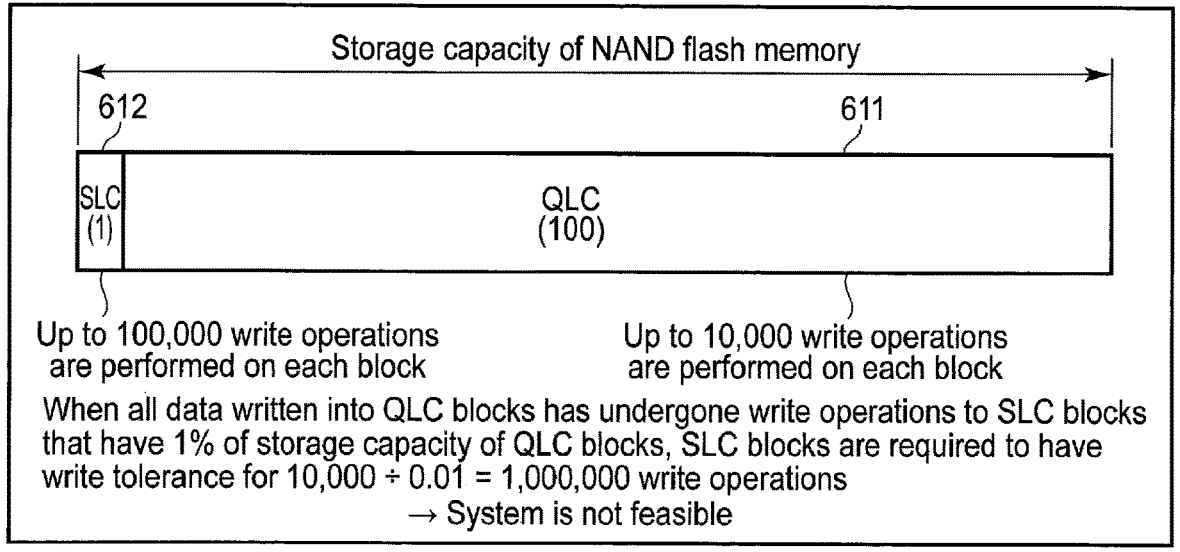
FIG. 7 is a diagram explaining an example of a relationship between a storage capacity and write tolerance of blocks used for write operations in each of SLC mode and QLC mode when user data is written in QLC mode via being written in SLC mode in the memory system of the embodiment.

In the example illustrated in FIG. 7, the following conditions are assumed.

(1) The entire storage capacity of the NAND flash memory 5 is composed of the storage capacity of the QLC blocks 611 in which data is written in the QLC mode (hereinafter also referred to as the QLC storage capacity), and the storage capacity of the SLC blocks 612 in which data is written in the SLC mode (hereinafter also referred to as the SLC storage capacity). The ratio of the QLC storage capacity to the SLC storage capacity is 100:1. That is, the SLC storage capacity is 1% of the QLC storage capacity.
(2) The maximum number of P/E cycles for each QLC block is 10,000 cycles.
(3) The maximum number of P/E cycles for each SLC block is 100,000 cycles.

In the method (B), user data received from the host 2 is temporarily written into an SLC block, and then rewritten into a QLC block. As described above with reference to FIG. 6, the write speed in the SLC mode is faster than the write speed in the QLC mode. Therefore, in order to achieve a certain write bandwidth, the storage capacity in the DRAM 6 allocated to the write buffer when write operations are performed in the SLC mode is small, compared with the storage capacity when write operations are performed in the QLC mode.

In the method (B), all the user data written into the QLC blocks 611 has undergone the write operations to the SLC blocks 612 that have 1% of the storage capacity of the QLC blocks 611. In this case, 1,000,000 (=10,000/0.01) write operations are performed to each SLC block if 10,000 write operations are performed to each QLC block. The number of P/E cycles exceeds the maximum number of P/E cycles for each SLC block.

Therefore, in the example illustrated in FIG. 7, when the method (B) is applied, a reduction in reliability may occur in the NAND flash memory 5, and a system according to the example is not feasible. For example, data cannot be written into the SLC blocks 612 where the number of performed P/E cycles reaches the maximum number of P/E cycles, so that it may be impossible to write into the NAND flash memory 5 user data whose write operation is newly requested by the host 2.

Figure 8:
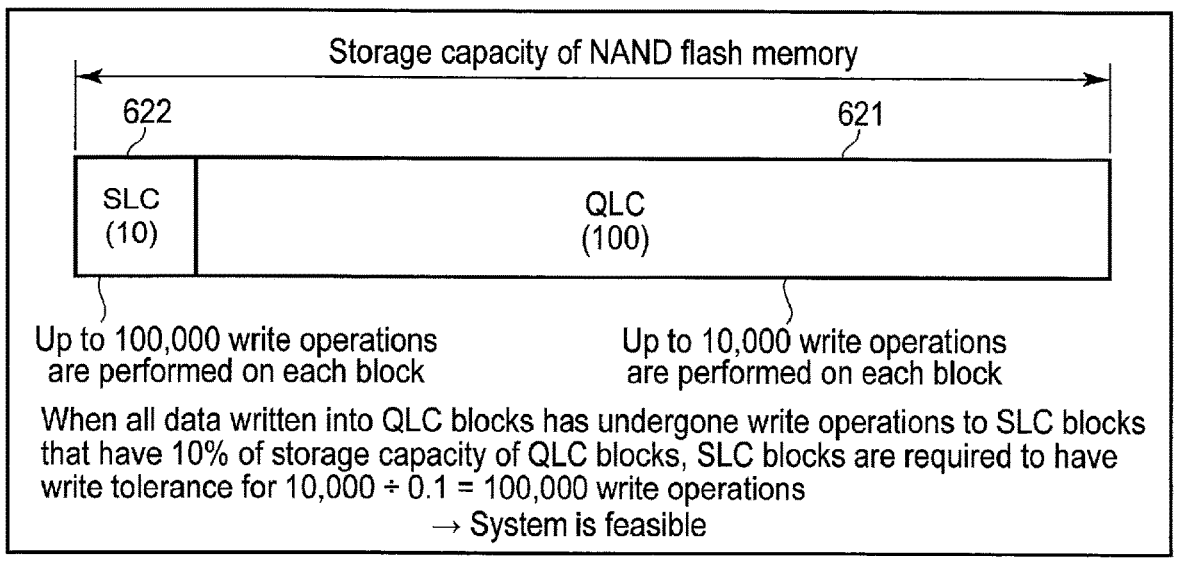
FIG. 8 is a diagram explaining another example of a relationship between a storage capacity and write tolerance of blocks used for writing in each of SLC mode and QLC mode when user data is written in QLC mode via writing in SLC mode in the memory system of the embodiment.

On the other hand, in the example illustrated in FIG. 8, the following conditions are assumed.
(1) The entire storage capacity of the NAND flash memory 5 is composed of the storage capacity of the QLC blocks 621 in which data is written in the QLC mode (the QLC storage capacity), and the storage capacity of the SLC blocks 622 in which data is written in the SLC mode (the SLC storage capacity). The ratio of the QLC storage capacity to the SLC storage capacity is 10:1. That is, the SLC storage capacity is 10% of the QLC storage capacity.
(2) The maximum number of P/E cycles for each QLC block is 10,000 cycles.
(3) The maximum number of P/E cycles for each SLC block is 100,000 cycles.
The conditions (2) and (3) are the same as those of the example illustrated in FIG. 7.

In the method (B), all the user data written into the QLC blocks 621 has undergone write operations to the SLC blocks 622 that have 10% of the storage capacity of the QLC blocks 621. In this case, if 10,000 write operations are performed to each QLC block, 100,000 (=10,000/0.1) write operations, that is, 100,000 P/E cycles, are performed to each SLC block. The number of P/E cycles is less than the maximum number of P/E cycles for each SLC block. In other words, in order that the number of P/E cycles performed in each SLC block 622 is less than the maximum number of P/E cycles for each SLC block, it can be said that it is necessary to allocate the SLC blocks 622 corresponding to the 10% storage capacity of the QLC blocks 621 in the blocks included in the NAND flash memory 5.

In this manner, a system according to the example illustrated in FIG. 8 is feasible when the method (B) is applied. However, use of the blocks corresponding to the 10% storage capacity of the QLC blocks 621 among the blocks included in the NAND flash memory 5 as the SLC blocks 622 reduces the entire storage capacity of the NAND flash memory 5, so that from the viewpoint of storage capacity, the NAND flash memory 5 is not efficiently utilized. That is, according to the method (B), since the storage capacity of the SLC blocks 622 is determined so that the number of P/E cycles performed for each SLC block 622 is less than the maximum number of P/E cycles of the SLC block, the storage capacity of the QLC blocks 621 decreases, whereby the economic efficiency of the NAND flash memory 5 remarkably deteriorates.

In the present embodiment, for example, when the write bandwidth is equal to or lower than the threshold, user data received from the host 2 in accordance with acceptance of a write command is written into the NAND flash memory 5 in the QLC mode. When the write bandwidth exceeds the threshold, the user data is written into the NAND flash memory 5 in the QLC mode or the SLC mode.

When the write bandwidth is equal to or lower than the threshold, user data to be written in the QLC mode is stored in the QLC write buffer 21, and the user data stored in the QLC write buffer 21 is written into the NAND flash memory 5 in the QLC mode.

Further, in response to the write bandwidth exceeding the threshold, the storage area in the DRAM 6 is further allocated to the SLC write buffer 22 in which user data to be written in the SLC mode is stored. When the write bandwidth exceeds the threshold, the user data stored in the QLC write buffer 21 is written into the NAND flash memory 5 in the QLC mode, and the user data stored in the SLC write buffer 22 is written into the NAND flash memory 5 in the SLC mode.

Figure 9:
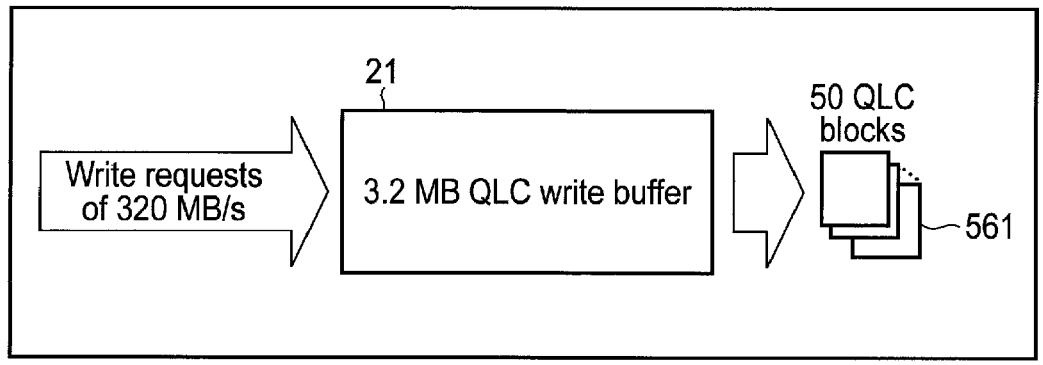
FIG. 9 is a diagram illustrating an example in which user data stored in a QLC write buffer is written into QLC blocks in parallel in the memory system of the embodiment when a write bandwidth is equal to or lower than a threshold.
Figure 10:
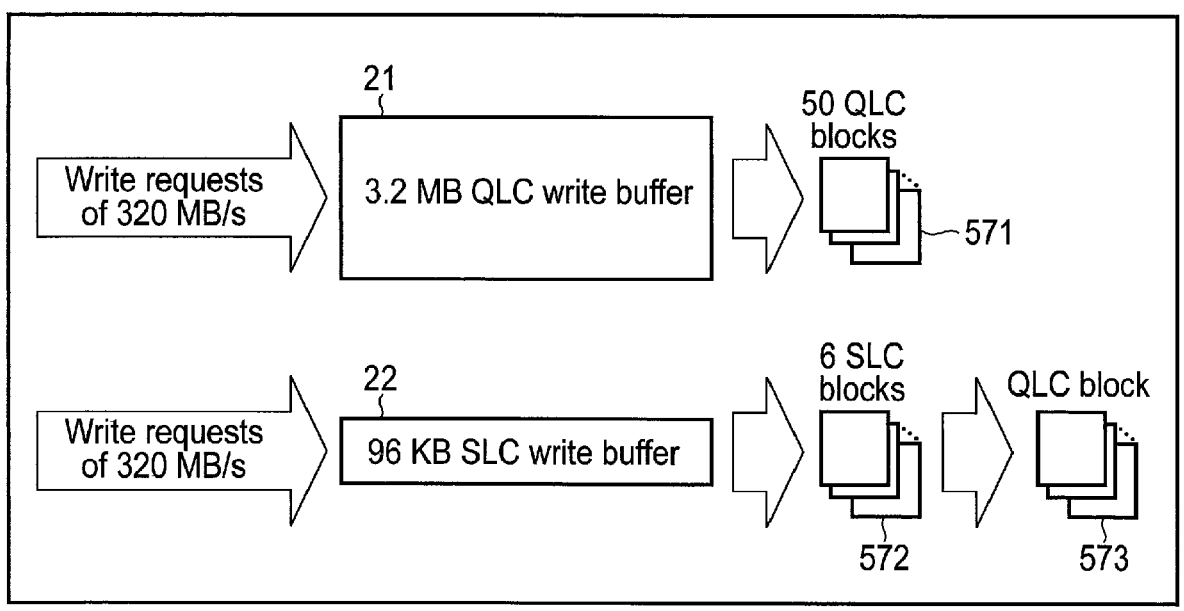
FIG. 10 is a diagram illustrating an example in which user data stored in a QLC write buffer is written into QLC blocks in parallel, and user data stored in an SLC write buffer is written into SLC blocks in parallel in the memory system of the embodiment when the write bandwidth exceeds the threshold.

Refer to FIGS. 9 and 10. An example is illustrated in which a write mode is selected according to the write bandwidth and one or more write buffers corresponding to the selected write mode are used. Here, as in the example described above with reference to FIGS. 6 to 8, in order to achieve a write bandwidth of 640 MB/s, a 6.4-MB write buffer is necessary when user data is written only in the QLC mode, and a 192-KB write buffer is necessary when user data is written only in the SLC mode. Further, the threshold is assumed to be 320 MB/s.

As illustrated in FIG. 9, when the write bandwidth is equal to or lower than 320 MB/s, all the user data received from the host 2 in accordance with acceptance of write commands is written in the QLC mode.

In order to achieve the write bandwidth of 320 MB/s, a 3.2-MB storage area in the DRAM 6 is allocated as the QLC write buffer 21, but no storage area in the DRAM 6 is allocated as the SLC write buffer 22. Therefore, all the user data received from the host 2 is stored in the QLC write buffer 21.

Then, the user data stored in the QLC write buffer 21 is written into multiple QLC blocks 561 in parallel. The number of the QLC blocks 561 is 50 at the maximum.

As illustrated in FIG. 10, when the write bandwidth exceeds 320 MB/s, and is equal to or lower than 640 MB/s, all the user data received from the host 2 in accordance with acceptance of write commands is written in the QLC mode or the SLC mode.

In order to achieve a write bandwidth of 640 MB/s, a 3.2-MB storage area in the DRAM 6 is allocated as the QLC write buffer 21. Further, a 96-KB storage area in the DRAM 6 is allocated as the SLC write buffer 22. Accordingly, user data received from the host 2 is stored in either the QLC write buffer 21 or the SLC write buffer 22.

The received user data is preferentially stored in the QLC write buffer 21, for example. In this case, when the QLC write buffer 21 has an available area for storing the received user data, this user data is stored in the QLC write buffer 21. On the other hand, when the QLC write buffer 21 does not have an available area for storing the received user data, this user data is stored in the SLC write buffer 22.

Then, the user data stored in the QLC write buffer 21 is written into multiple QLC blocks 571 in parallel. The number of the QLC blocks 571 is 50 at the maximum.

Similarly, the user data stored in the SLC write buffer 22 is written into multiple SLC blocks 572 in parallel. The number of the SLC blocks 572 is six at the maximum.

The user data written into each SLC block 572 is read and written into QLC blocks 573 while the SSD 3 is in an idle state, for example. That is, the user data is written into the SLC block 572 temporarily when the write bandwidth exceeds 320 MB/s, and then the user data is rewritten into the QLC block 573.

In an operation for moving user data from the SLC block 572 to the QLC block 573, the user data written into the SLC block 572 is not erased until a write operation of the user data to the QLC block 573 as the move destination is completed. Therefore, during this operation, even if power supplied from the external power source to the SSD 3 is shut off, the user data to be moved will not be lost. Accordingly, after power is supplied from the external power source to the SSD 3, the operation for moving the user data from the SLC block 572 to the QLC block 573 may be performed again.

As described above, in order to achieve a write bandwidth of 640 MB/s, when user data is written into the NAND flash memory 5 only in the QLC mode, it is necessary to allocate a 6.4-MB storage area in the DRAM 6 as the QLC write buffer 21. However, in the method illustrated in FIG. 10, the write bandwidth of 320 MB/s is supported by write operations in the QLC mode and the write bandwidth of remaining 320 MB/s is supported by write operations in the SLC mode, whereby it is possible to reduce the size of the storage area in the DRAM 6 allocated as the QLC write buffer 21 and the SLC write buffer 22 to 3.2 MB+96 KB.

As a result, when power supplied from the external power source to the SSD 3 is shut off, the amount of electric charge required for writing user data stored in the write buffers 21 and 22 into the NAND flash memory 5 in the SLC mode by using the PLP function, that is, the amount of electric charge to be stored in the power storage device 71, can be reduced.

On the other hand, in order to achieve a write bandwidth of 640 MB/s, when all the user data received from the host 2 in accordance with acceptance of write commands is temporarily written into the NAND flash memory 5 in the SLC mode, a 192-KB storage area in the DRAM 6 is to be allocated as the SLC write buffer 22. Also, none of the storage areas in the DRAM 6 are allocated as the QLC write buffer 21. Therefore, the storage capacity in the DRAM 6 allocated as a write buffer may be made smaller than that in the example illustrated in FIG. 10, whereby the amount of electric charge to be stored in the power storage device 71 (that is, the amount of electric charge required for the PLP operation) may be further reduced.

However, in the configuration in which all the user data written temporarily in the SLC mode is rewritten in the QLC mode, as described above with reference to FIG. 8, it is necessary that the entire storage capacity of the NAND flash memory 5 is composed of the QLC storage capacity and the SLC storage capacity that has 10% of the QLC storage capacity. This deteriorates the economic efficiency of the NAND flash memory 5.

Therefore, in the present embodiment, as illustrated in FIG. 10, in order to achieve the write bandwidth of 640 MB/s, a write bandwidth of 320 MB/s is supported by write operations in the QLC mode, and the write bandwidth of the remaining 320 MB/s is supported by write operations in the SLC mode. This makes it possible to reduce the SLC storage capacity of the entire storage capacity of the NAND flash memory 5 while satisfying the requirement of the write bandwidth from the host 2 and to improve the economic efficiency of the NAND flash memory 5.

Return to FIG. 1. The configuration for implementing the above-described operation will be specifically exemplified. The CPU 12 may function as a mode control module 121, a write control module 122, a buffering processing module 123, a PLP processing module 124, and a rewrite processing module 125.

The mode control module 121 controls a write mode for writing user data, which is received from the host 2 in accordance with acceptance of a write command, into the NAND flash memory 5. The mode control module 121 selects the first mode in which N-bit data is written per memory cell and/or the second mode in which M-bit data is written per memory cell as a write mode. Here N is equal to or larger than one and M is larger than N.

More specifically, the mode control module 121 is configured to dynamically switch whether to use the second mode alone as the write mode or to use the first mode and the second mode together as the write mode on the basis of, for example, the write bandwidth that is a write speed requested by the host 2 to the SSD 3.

Examples of combinations of the first and second modes are as follows.

Combination #1: The SLC mode is used as the first mode and the QLC mode is used as the second mode.

Combination #2: The SLC mode is used as the first mode and the TLC mode is used as the second mode.

Combination #3: The SLC mode is used as the first mode and the MLC mode is used as the second mode.

Combination #4: The MLC mode is used as the first mode and the TLC mode is used as the second mode.

Combination #5: The MLC mode is used as the first mode and the QLC mode is used as the second mode.

Combination #6: The TLC mode is used as the first mode and the QLC mode is used as the second mode.

Alternatively, the mode control module 121 may be configured to dynamically switch whether to use a third mode alone as the write mode or to use the first mode, the second mode, and the third mode together as the write mode. The third mode is a mode in which L-bit data is written per memory cell, and L is larger than M.

Examples of combinations of the first, second, and third modes are as follows.

Combination #7: The SLC mode is used as the first mode, the MLC mode is used as the second mode, and the TLC mode is used as the third mode.

Combination #8: The SLC mode is used as the first mode, the TLC mode is used as the second mode, and the QLC mode is used as the third mode.

Combination #9: The SLC mode is used as the first mode, the MLC mode is used as the second mode, and the QLC mode is used as the third mode.

Combination #10: The MLC mode is used as the first mode, the TLC mode is used as the second mode, and the QLC mode is used as the third mode.

In a similar manner, the mode control module 121 may be configured to dynamically select modes from four or more modes that have different numbers of bits to be stored per memory cell, as the write mode.

Hereinafter, a case where the combination #1 is used will be exemplified. In this case, the mode control module 121 dynamically switches between a write mode in which the QLC mode is used alone (hereinafter also referred to as a QLC single mode), and a write mode in which the QLC mode and the SLC mode are used together (hereinafter referred to as a QLC/SLC combination mode).

The mode control module 121 is configured to measure a write bandwidth, and to dynamically switch a mode selected as the write mode between the QLC single mode and the QLC/SLC combination mode on the basis of the measured write bandwidth.

The mode control module 121 totals, as a requested write amount 24, a total amount of user data that the host 2 has requested to write within a first time period (that is, a total amount of user data received from the host 2 in accordance with acceptance of one or more write commands within the first time period). For example, the mode control module 121 accumulates, from a certain time until the first time period elapses, the requested write amount 24 every time the host 2 requests a write operation. When the first time period elapses, the mode control module 121 calculates the write bandwidth by dividing the acquired requested write amount 24 by the first time period.

When the write bandwidth is equal to or lower than the threshold, the mode control module 121 selects the QLC single mode as the write mode. An area in the DRAM 6 is allocated in advance, for example when the SSD 3 starts, as the QLC write buffer 21 in which user data to be written in the QLC mode is stored.

On the other hand, when the write bandwidth exceeds the threshold, the mode control module 121 selects the QLC/SLC combination mode as the write mode. In response to the write bandwidth exceeding the threshold, the mode control module 121 allocates an area in the DRAM 6 as the SLC write buffer 22 in which user data to be written in the SLC mode is stored. In addition, the mode control module 121 releases the SLC write buffer 22 in response to all the user data stored in the SLC write buffer 22 being written into the NAND flash memory 5.

The buffering processing module 123 stores user data, which is received from the host 2 in accordance with acceptance of a write command, in one of the write buffers 21 and 22 in the DRAM 6 according to the write mode determined by the mode control module 121. The write control module 122 writes the user data stored in the write buffers 21 and 22 into the NAND flash memory 5 for each data of a write unit size.

Figure 11:
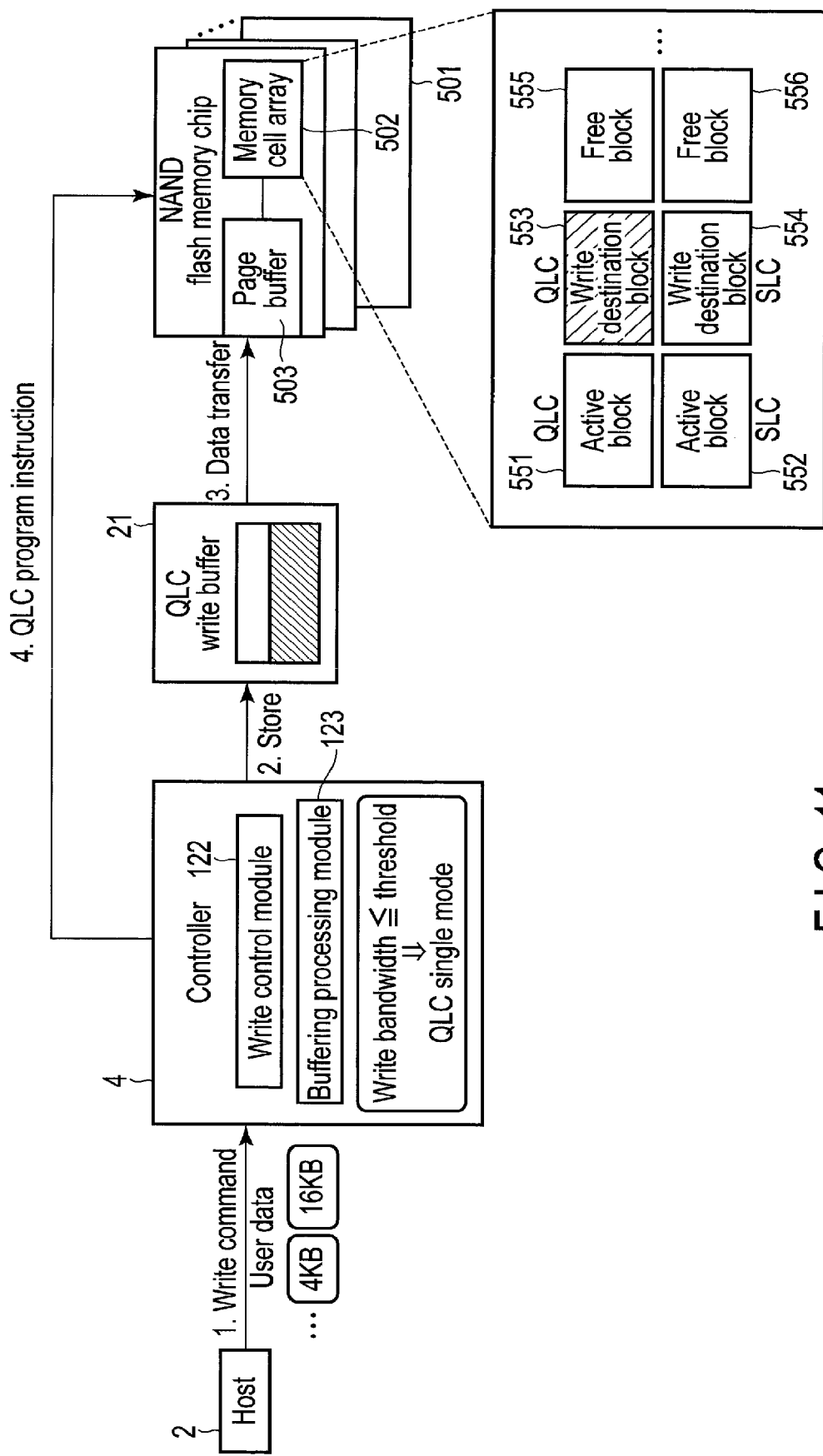
FIG. 11 is a diagram illustrating an example in which user data is written into a NAND flash memory in QLC mode in the memory system of the embodiment when the write bandwidth is equal to or lower than the threshold.

As illustrated in FIG. 11, when the write bandwidth is equal to or lower than the threshold and the QLC single mode is selected as the write mode, the buffering processing module 123 stores the received user data in the QLC write buffer 21. Then, the write control module 122 writes each user data of a write unit size in the QLC mode for the NAND flash memory 5, which is stored in the QLC write buffer 21, into the NAND flash memory 5.

More specifically, when the QLC write buffer 21 stores user data of the write unit size in the QLC mode for the NAND flash memory 5, the write control module 122 transfers the user data of the write unit size to the page buffer 503 in the NAND flash memory chip 501. The write unit size in the QLC mode is, for example, data of four pages, that is, 64-KB data.

Then, the write control module 122 instructs the NAND flash memory chip 501 to program in the QLC mode. That is, the write control module 122 sends a program command to the NAND flash memory chip 501, thereby programming the transferred user data (that is, the user data stored in the page buffer 503) into a write destination block 553 in the memory cell array 502 in the QLC mode.

Further, the write control module 122 performs a data transfer and a program instruction again for the same user data. That is, as described above with reference to FIG. 6, for user data of the write unit size in the QLC mode, the write control module 122 performs a first data transfer and a first program instruction and then performs a second data transfer and a second time program instruction.

The memory cell array 502 includes multiple blocks 551 to 556. The blocks are classified into active blocks and free blocks. Each active block stores valid data. Each free block does not store valid data and is available for writing new data after erasing data on it. When one block is selected from one or more free blocks and an erase-process is performed on the block, the block is allocated as a write destination block 553. The write destination block 553 can store valid data.

Next, in response to the completion of this program, the write control module 122 releases the area in the QLC write buffer 21 where the transferred user data is stored. The write control module 122 maps an LBA specified in a write command and a physical address of the NAND flash memory 5 to which the user data is written and updates the LUT 26 using an entry indicative of the mapping. In addition, the write control module 122 updates the LBA range/write mode table 27 using an entry indicative of the LBA (or LBA range) specified in the write command and the write mode (here, QLC mode) associated with the LBA.

Note that the write control module 122 may perform write operations for writing multiple items of user data of the write unit size, which are stored in the QLC write buffer 21, into multiple NAND flash memory chips 501 in parallel. That is, the write control module 122 may write the multiple items of user data of the write unit size to multiple QLC write destination blocks, respectively, in parallel. The multiple QLC write destination blocks are allocated in the multiple NAND flash memory chips 501, respectively.

As illustrated in FIG. 12, when the write bandwidth exceeds the threshold and the QLC/SLC combination mode is selected as the write mode, the buffering processing module 123 stores received user data in the QLC write buffer 21 or in the SLC write buffer 22.

For example, when the write bandwidth exceeds the threshold, the buffering processing module 123 determines a ratio between a first data amount stored in the SLC write buffer 22 and a second data amount stored in the QLC write buffer 21. The first data amount is an amount of data to be written into the NAND flash memory 5 in the SLC mode. The second data amount is an amount of data to be written into the NAND flash memory 5 in the QLC mode. For example, as the write speed increases, the buffering processing module 123 increases the ratio of the first data amount to the sum of the first data amount and the second data amount (that is, the total amount of the user data written into the NAND flash memory 5).

In this case, the buffering processing module 123 stores the received user data in preference to the QLC write buffer 21, for example. For example, the buffering processing module 123 stores the received user data in the QLC write buffer 21 when the QLC write buffer 21 has an available area for storing the received user data. On the other hand, the buffering processing module 123 stores the received user data in the SLC write buffer 22 when the QLC write buffer 21 does not have an available area for storing the received user data.

The buffering processing module 123 may store the received user data in preference to the SLC write buffer 22, for example. In this case, the buffering processing module 123 stores the received user data in the SLC write buffer 22 when the SLC write buffer 22 has an available area for storing the received user data. On the other hand, the buffering processing module 123 stores the received user data in the QLC write buffer 21 when the SLC write buffer 22 does not have an available area for storing the received user data.

The write control module 122 writes the user data stored in each of the QLC write buffer 21 and the SLC write buffer 22 into the NAND flash memory 5 for each data of a write unit size.

More specifically, when user data of a write unit size in the QLC mode (for example, data of four pages) with respect to the NAND flash memory 5 is stored in the QLC write buffer 21, the write control module 122 transfers the user data of the write unit size to the page buffer 503 in the NAND flash memory chip 501.

The write control module 122 instructs the NAND flash memory chip 501 to program the transferred user data in the QLC mode. That is, the write control module 122 sends a program command to the NAND flash memory chip 501, thereby programming the transferred user data into a write destination block 553 in the memory cell array 502 in the QLC mode. Further, the write control module 122 performs a data transfer and a program instruction again for the same user data.

Then, in response to the completion of this program, the write control module 122 releases the area in the QLC write buffer 21 where the transferred user data is stored. The write control module 122 maps an LBA specified in a write command and a physical address of the NAND flash memory 5 to which the user data is written and updates the LUT 26 using an entry indicative of the mapping. In addition, the write control module 122 updates the LBA range/write mode table 27 using an entry indicative of the LBA (or LBA range) specified in the write command and the write mode (here, QLC mode) associated with the LBA.

Further, when user data of a write unit size in the SLC mode for the NAND flash memory 5 is stored in the SLC write buffer 22, the write control module 122 transfers the user data of the write unit size (for example, data of one page) to the page buffer 503 in the NAND flash memory chip 501.

The write control module 122 instructs the NAND flash memory chip 501 to program the transferred user data in the SLC mode. That is, the write control module 122 sends a program command to the NAND flash memory chip 501, thereby programming the transferred user data into a write destination block 554 in the memory cell array 502 in the SLC mode.

Then, in response to the completion of this program, the write control module 122 releases the area in the SLC write buffer 22 where the transferred user data is stored. The write control module 122 maps an LBA specified in the write command and a physical address of the NAND flash memory 5 to which the user data is written and updates the LUT 26 using an entry indicative of the mapping. In addition, the write control module 122 updates the LBA range/write mode table 27 using an entry indicative of the LBA (or LBA range) specified in the write command and the write mode (here, SLC mode) associated with the LBA.

Note that the write control module 122 may perform an operation for writing multiple items of user data of a write unit size stored in the QLC write buffer 21 to multiple NAND flash memory chips 501 in parallel, and perform an operation for writing multiple items of user data of a write unit size stored in the SLC write buffer 22 to the different multiple NAND flash memory chips 501 in parallel. That is, the write control module 122 may write each of the items of user data of the write unit size stored in the QLC write buffer 21 into each of multiple QLC write destination blocks in parallel, and write each of the items of user data of the write unit size stored in the SLC write buffer 22 into each of multiple SLC write destination blocks in parallel. The multiple QLC write destination blocks are allocated in the multiple NAND flash memory chips 501, respectively, and the multiple SLC write destination blocks are allocated in different multiple NAND flash memory chips 501, respectively.

As described above, the buffering processing module 123 and the write control module 122 can write user data, which is received from the host 2 in accordance with acceptance of a write command, into the NAND flash memory 5 in a write mode determined by the mode control module 121 according to the write bandwidth.

When power supplied from the external power source to the SSD 3 is shut off, the PLP processing module 124 writes user data stored in the write buffers 21 and 22 into the NAND flash memory 5 in a specific write mode using electric charge stored in the power storage device 71. This specific write mode is, for example, the SLC mode.

FIG. 13 illustrates a write operation by the PLP processing module 124 when power supplied from the external power source to the SSD 3 is shut off while the write bandwidth is equal to or lower than the threshold (that is, while the write mode is the QLC single mode). When power supplied from the external power source to the SSD 3 is shut off, the PLP processing module 124 writes user data stored in the QLC write buffer 21 into the NAND flash memory 5 in the SLC mode.

More specifically, when user data is stored in the QLC write buffer 21, the PLP processing module 124 transfers user data of a write unit size in the SLC mode for the NAND flash memory 5 from the QLC write buffer 21 to the page buffer 503 in the NAND flash memory 5. The write unit size is, for example, one page, that is, 16 KB.

Then, the PLP processing module 124 instructs the NAND flash memory chip 501 to program the transferred user data in the SLC mode. In other words, the controller 4 sends a program command to the NAND flash memory chip 501, thereby programming the transferred user data into a write destination block 554 in the memory cell array 502 in the SLC mode.

Then, in response to the completion of this program, the PLP processing module 124 releases the area in the QLC write buffer 21 where the transferred user data is stored. In addition, the PLP processing module 124 updates the LUT 26 and the LBA range/write mode table 27. The details of this update are the same as the case where the write control module 122 writes user data into the NAND flash memory 5 in the SLC mode in the example illustrated in FIG. 12.

The PLP processing module 124 repeatedly performs such a write operation until there is no user data stored in the QLC write buffer 21. As a result, even when power supplied to the SSD 3 from the external power source is shut off, user data stored in the QLC write buffer 21, which is a volatile storage area in the DRAM 6, can be written into the NAND flash memory 5. Therefore, data consistency between the host 2 and the SSD 3 can be guaranteed by using the PLP function.

FIG. 14 illustrates a write operation by the PLP processing module 124 when power supplied from the external power source to the SSD 3 is shut off while the write bandwidth exceeds the threshold (that is, while the write mode is the QLC/SLC combination mode). When power supplied from the external power source to the SSD 3 is shut off, the PLP processing module 124 writes user data stored in the QLC write buffer 21 and user data stored in the SLC write buffer 22 into the NAND flash memory 5 in the SLC mode.

More specifically, when user data is stored in the QLC write buffer 21, the PLP processing module 124 transfers user data of a write unit size (for example, user data of one page) in the SLC mode for the NAND flash memory 5 from the QLC write buffer 21 to the page buffer 503 in the NAND flash memory 5.

Then, the PLP processing module 124 instructs the NAND flash memory chip 501 to program in the SLC mode. That is, the PLP processing module 124 sends a program command to the NAND flash memory chip 501, thereby programming the user data stored in the page buffer 503 into a write destination block 554 in the memory cell array 502 in the SLC mode. Then, in response to the completion of this program, the PLP processing module 124 releases the area in the QLC write buffer 21 in which the transferred user data is stored, and updates the LUT 26 and the LBA range/write mode table 27.

In addition, when user data is stored in the SLC write buffer 22, the PLP processing module 124 transfers user data of a write unit size (for example, user data of one page) in the SLC mode for the NAND flash memory 5 from the SLC write buffer 22 to the page buffer 503 in the NAND flash memory 5.

Then, the PLP processing module 124 instructs the NAND flash memory chip 501 to program in the SLC mode. That is, the PLP processing module 124 sends a program command to the NAND flash memory chip 501, thereby programming the user data stored in the page buffer 503 into a write destination block 554 in the memory cell array 502 in the SLC mode. Then, in response to the completion of this program, the PLP processing module 124 releases the area in the SLC write buffer 22 in which the transferred user data is stored, and updates the LUT 26 and the LBA range/write mode table 27.

The PLP processing module 124 repeatedly performs such a write operation until there is no user data stored in the QLC write buffer 21 and the SLC write buffer 22. As a result, even when power supplied from the external power source to the SSD 3 is shut off, user data stored in the QLC write buffer 21 and the SLC write buffer 22, which are volatile storage areas in the DRAM 6, can be written into the NAND flash memory 5. Therefore, data consistency between the host 2 and the SSD 3 can be guaranteed by using the PLP function.

Further, the rewrite processing module 125 performs a rewrite operation for rewriting user data, which is temporarily written into the NAND flash memory 5 in the SLC mode, into the NAND flash memory 5 in the QLC mode. This rewrite operation may be performed, for example, during a period when the SSD 3 is in an idle state.

As illustrated in FIG. 15, the rewrite processing module 125 writes user data, which is written in the SLC mode in the NAND flash memory 5 in the operations illustrated in FIGS. 12 to 14, into the NAND flash memory 5 in the QLC mode and invalidates the user data written in the SLC mode. The user data written in the SLC mode in the NAND flash memory 5 may include user data written into the NAND flash memory 5 in the SLC mode when the write bandwidth exceeds the threshold and user data written into the NAND flash memory 5 in the SLC mode by the PLP function. Therefore, by this rewrite operation, the mode in which certain user data is written into the NAND flash memory 5 is changed from the SLC mode to the QLC mode.

More specifically, the rewrite processing module 125 specifies a physical address of user data written in the SLC mode by using the LBA range/write mode table 27 and the LUT 26. The rewrite processing module 125 reads user data of the specified physical address from the NAND flash memory 5 into the rewrite buffer 23. The specified physical address indicates, for example, a physical storage location in an active block 552 that includes user data written in the SLC mode. In this case, the rewrite processing module 125 reads the user data from the physical storage location in the active block 552 into the rewrite buffer 23.

When user data of a write unit size in the QLC mode (for example, user data of four pages) with respect to the NAND flash memory 5 is stored in the rewrite buffer 23, the rewrite processing module 125 transfers the user data of the write unit size to the page buffer 503 in the NAND flash memory chip 501.

The rewrite processing module 125 then instructs the NAND flash memory chip 501 to program in the QLC mode. In other words, the controller 4 sends a program command to the NAND flash memory chip 501, thereby programming the transferred user data into a write destination block 553 in the memory cell array 502 in the QLC mode. Further, the rewrite processing module 125 performs a data transfer and a program instruction again for the same user data. That is, as described above with reference to FIG. 6, the rewrite processing module 125 performs a first data transfer and a first program instruction for user data of the write unit size in the QLC mode, and then performs a second data transfer and a second program instruction for the user data.

Then, in response to the completion of this program, the rewrite processing module 125 updates the LUT 26 and the LBA range/write mode table 27, and releases the area in the rewrite buffer 23 in which the transferred user data is stored.

For example, the rewrite processing module 125 may repeatedly perform the above-described operation until all the items of user data, which are temporarily written in the SLC mode, are written into the NAND flash memory 5 in the QLC mode during the period when the SSD 3 is in an idle state. As a result, user data that is temporarily written in the SLC mode due to the write bandwidth exceeding the threshold or by the PLP function can be written into the NAND flash memory 5 in the QLC mode with higher storage density per memory cell.

In the above example, the assumed maximum write bandwidth (for example, 640 MB/s) is determined, and half of the write bandwidth (for example, 320 MB/s) is set as the threshold. The threshold may be any value as long as it is lower than the maximum write bandwidth. Further, the threshold may be set in consideration of the storage capacity of the DRAM 6, the write speed in each mode for the NAND flash memory 5, the maximum power consumption, and the like.

With the above configuration, it is possible to efficiently utilize the NAND flash memory 5 while satisfying the requirement of the write bandwidth by the host 2. When the write bandwidth, which is the reception speed of user data from the host 2 in accordance with acceptance of one or more write commands, is equal to or lower than the threshold, the mode control module 121 selects the second mode that has a high storage density, as the write mode. When the write bandwidth exceeds the threshold, the mode control module 121 selects the second mode and the first mode that has the storage density lower than that of the second mode, as the write mode. Thus, when in the SSD 3 having the PLP function, user data, which is temporarily written in the first mode having a low storage density, is rewritten in the second mode having a higher storage density, it is possible to improve the economic efficiency regarding the storage capacity of the NAND flash memory 5 while satisfying the requirement of the write bandwidth by the host 2.

With reference to FIGS. 16A and 16B, a relationship between the write bandwidth and a workload will be described. FIGS. 16A and 16B illustrate examples of transition of the write bandwidth. A workload from the host 2 to the SSD 3 may be derived from the transition of the write bandwidth.

In a transition 61 of the write bandwidth illustrated in FIG. 16A, an entire area 62 determined by this transition 61 corresponds to an entire workload from the host 2 to the SSD 3 in the period corresponding to the transition 61. Then, an area 63A and an area 63B of portions that exceed the threshold (320 MB/s in this case) out of the entire area 62 correspond to a workload that requires a write bandwidth exceeding 320 MB/s in this period.

In the example illustrated in FIG. 16A, the ratio of the area 63A and the area 63B of the portions exceeding the threshold to the entire area 62 is 1/10. This indicates that 10% of the entire workload by the host 2 requires a write bandwidth exceeding 320 MB/s and the remaining 90% of the entire workload needs only a write bandwidth of 320 MB/s or less. That is, the amount of data written in the SLC mode is 10% of the total write amount of data.

In this case, under the conditions of the example illustrated in FIG. 7, that is, under the conditions in which the SLC storage capacity is 1% of the QLC storage capacity, the maximum number of P/E cycles of the QLC block is 10,000, and the maximum number of P/E cycles of the SLC block is 100,000, a system according to the example of FIG. 16A is feasible. More specifically, since 10% of the total write amount of data undergoes write operations to the SLC blocks, 100,000 (=10,000×0.1/0.01) write operations are performed for each SLC block while 10,000 write operations are performed for each QLC block. This number of write operations to each SLC block is less than the maximum number of P/E cycles for the SLC block, therefore the system is feasible.

On the other hand, in a transition 65 of the write bandwidth illustrated in FIG. 16B, an entire area 66 determined by this transition 65 corresponds to an entire workload from the host 2 to the SSD 3 in the period corresponding to the transition 65. An area 67 of a portion exceeding the threshold (320 MB/s in this case) out of the entire area 66 corresponds to a workload that requires a write bandwidth exceeding 320 MB/s in this period.

In the example illustrated in FIG. 16B, a ratio of the area 67 of the portion exceeding the threshold to the entire area 66 is 1/4. This indicates that 25% of the workload by the host 2 requires the write bandwidth exceeding 320 MB/s and the remaining 75% of the workload needs only the write bandwidth of 320 MB/s or less. That is, the amount of data written in the SLC mode is 25% of the total write amount of data.

In this case, under the conditions of the example illustrated in FIG. 7, that is, under the conditions in which the SLC storage capacity is 1% of the QLC storage capacity, the maximum number of P/E cycles of the QLC block is 10,000, and the maximum number of P/E cycles of the SLC block is 100,000, a system according to the example illustrated in FIG. 16B is not feasible. More specifically, since 25% of the total write amount of data undergoes write operations to the SLC blocks, 250,000 (=10,000×0.25/0.01) write operations are performed for each SLC block while 10,000 write operations are performed for each QLC block. This number of write operations for each SLC block exceeds the maximum number of P/E cycles for the SLC block, and therefore the system is not feasible. In such a case, in the host 2, for example, a response from the SSD 3 is delayed, and the write bandwidth decreases.

In this way, it is possible to derive a ratio of the workload which requires a write bandwidth exceeding the threshold, to the entire workload from the transition of the write bandwidth, and determine whether the system is feasible under a certain condition based on the derived ratio.

The procedure of processes performed by the controller 4 will be described with reference to flowcharts of FIGS. 17 to 22. The controller 4 may perform a mode control process, a buffering process, an SLC write process, and a QLC write process illustrated in the flowcharts of FIGS. 17 to 20 in parallel. Further, in response to a shutoff of power supplied from the external power source to the SSD 3, the controller 4 performs a PLP process illustrated in the flowchart of FIG. 21. Further, the controller 4 performs a rewrite process illustrated in the flowchart of FIG. 22 during idle time.

The flowchart of FIG. 17 illustrates an example of the procedure of the mode control process performed by the controller 4. In the mode control process, the write mode used for write operations to the NAND flash memory 5 is switched according to the write bandwidth indicative of the write speed requested by the host 2. Here, a case where the controller 4 switches between the QLC single mode and the QLC/SLC combination mode as the write mode will be described as an example.

First, the controller 4 initializes a requested write amount 24 (step S101). The requested write amount 24 is used for totaling an amount of user data of which write operation is requested by the host 2.

Next, the controller 4 determines whether it is time to update the write bandwidth (step S101). The write bandwidth may be updated every first time period (for example, every 100 milliseconds). The controller 4 may determine that it is time to update the write bandwidth when the first time period has elapsed since the write bandwidth was last updated.

When it is not time to update the write bandwidth (NO in step S102), the process returns to step S102 and it is again determined whether it is time to update the write bandwidth.

On the other hand, when it is time to update the write bandwidth (YES in step S102), the controller 4 updates the write bandwidth on the basis of the requested write amount 24 (step S103). That is, the controller 4 updates the write bandwidth by calculating a requested write speed (=requested write amount/first time period) on the basis of the requested write amount 24 that indicates a total amount of the user data received from the host 2 in accordance with acceptance of one or more write commands within the most recent first time period. Then, the controller 4 initializes the requested write amount 24 (step S104).

Next, the controller 4 determines whether the updated write bandwidth exceeds the threshold (step S105). When the write bandwidth exceeds the threshold (YES in step S105), the process branches according to the current write mode (step S106).

When the current write mode is the QLC single mode (QLC in step S106), the controller 4 allocates a storage area in the DRAM 6 to the SLC write buffer 22 (step S107). Then, the controller 4 selects the QLC/SLC combination mode as the write mode (step S108) and the process returns to step S102.

On the other hand, when the current write mode is the QLC/SLC combination mode (QLC/SLC in step S106), the process returns to step S102.

In addition, when the write bandwidth is equal to or lower than the threshold (NO in step S105), the process branches according to the current write mode (step S109). When the current write mode is the QLC single mode (QLC in step S109), the write mode is maintained in the QLC single mode even in the updated write bandwidth, so that the process returns to step S102.

When the current write mode is the QLC/SLC combination mode (QLC/SLC in step S109), the controller 4 determines whether user data is stored in the SLC write buffer 22 (step S110). When user data is stored in the SLC write buffer 22 (YES in step S110), the process returns to step S110. That is, by making the determination in step S110, the controller 4 waits for the completion of the SLC write process for writing the user data in the SLC write buffer 22 into the NAND flash memory 5 in the SLC mode. The SLC write process will be described later with reference to the flowchart of FIG. 19.

On the other hand, when user data is not stored in the SLC write buffer 22 (NO in step S110), the controller releases the SLC write buffer 22 (step S111). As a result, no storage area in the DRAM 6 is allocated as the SLC write buffer 22. Then, the controller 4 selects the QLC single mode as the write mode (step S112) and the process returns to step S102.

As described above, it is possible to select the write mode of the NAND flash memory 5 according to the write bandwidth of the host 2. The QLC mode is used alone when the write bandwidth is lower than the threshold, and the QLC mode and the SLC mode are used in parallel when the write bandwidth exceeds the threshold, whereby it is possible to improve the economic efficiency of the SSD 3 by suppressing an increase in storage capacity of the DRAM 6 allocated as the write buffers 21 and 22, and prioritizing write operations in the QLC mode over the SLC mode.

Figure 18:
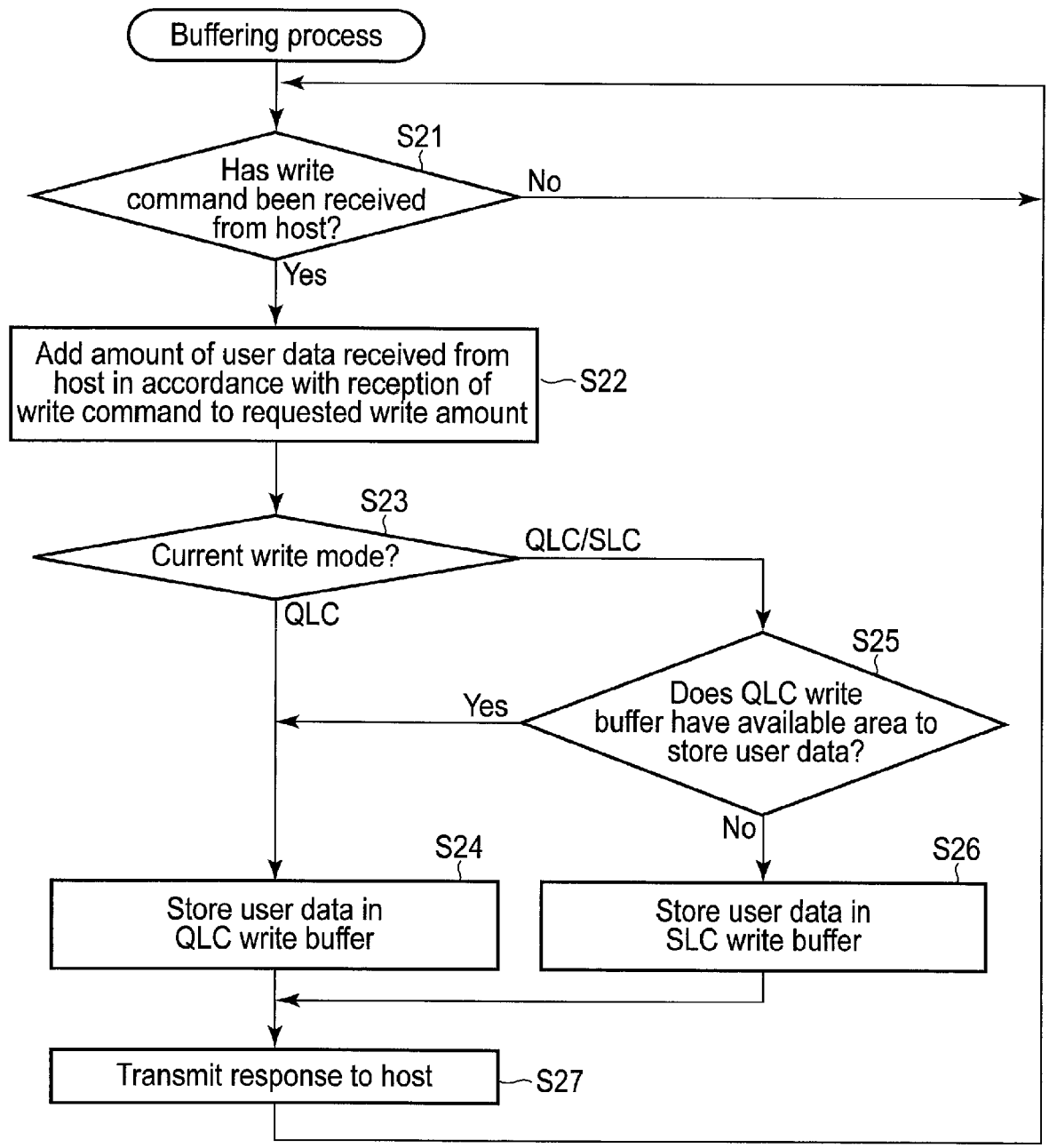
FIG. 18 is a flowchart of an example of the procedure of a buffering process executed in the memory system of the embodiment.

The flowchart of FIG. 18 illustrates an example of the procedure of the buffering process performed by the controller 4. In the buffering process, user data received from the host 2 in accordance with acceptance of a write command is stored in a write buffer corresponding to the write mode that is selected in the above-described mode control process.

First, the controller 4 determines whether a write command from the host 2 has been received (step S21). When a write command from the host 2 has not been received (NO in step S21), the process returns to step S21, and it is again determined whether a write command from the host 2 has been received.

When a write command has been received from the host 2 (YES in step S21), the controller 4 adds an amount of user data, which is received from the host 2 in accordance with the acceptance of the write command, to the requested write amount 24 (step S22). Then, the process branches according to the current write mode (step S23). When the current write mode is the QLC single mode (QLC in step S23), the controller 4 stores the user data in the QLC write buffer 21 (step S24). Then, the controller 4 returns a response for the write command to the host 2 (step S27), and the process returns to step S21.

On the other hand, when the current write mode is the QLC/SLC combination mode (QLC/SLC in step S23), the controller 4 determines whether the QLC write buffer 21 has an available area for storing the user data (step S25). When the QLC write buffer 21 has an available area (YES in step S25), the controller 4 stores the user data in the QLC write buffer 21 (step S24) and the process returns to step S21. When the QLC write buffer 21 does not have any available area (NO in step S25), the controller 4 stores the user data in the SLC write buffer 22 (step S26). Then, the controller 4 returns a response for the write command to the host 2 (step S27), and the process returns to step S21.

As described above, user data received from the host 2 in accordance with acceptance of a write command can be stored in the QLC write buffer 21 or in the SLC write buffer 22 appropriately according to the current write mode.

Figure 19:
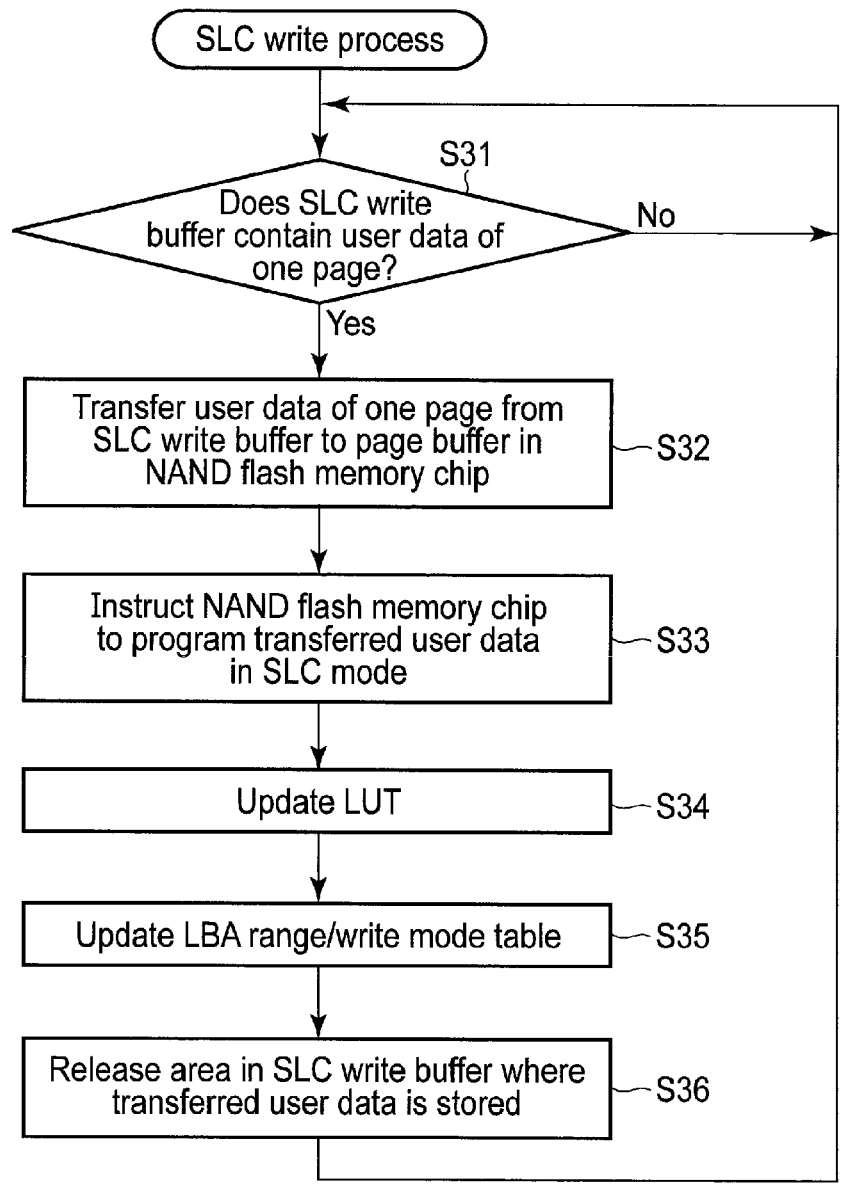
FIG. 19 is a flowchart of an example of the procedure of an SLC write process executed in the memory system of the embodiment.

The flowchart of FIG. 19 illustrates an example of the procedure of the SLC write process performed by the controller 4. In the SLC write process, user data stored in the SLC write buffer 22 is written into the NAND flash memory 5 in the SLC mode. The SLC write process is performed while a storage area in the DRAM 6 is allocated as the SLC write buffer 22.

First, the controller 4 determines whether user data of one page is stored in the SLC write buffer 22 (step S31). When user data of one page is not stored (NO in step S31), the process returns to step S31.

On the other hand, when user data of one page is stored (YES in step S31), the controller 4 transfers the user data of one page from the SLC write buffer 22 to the page buffer 503 in the NAND flash memory chip 501 (step S32). The controller 4 instructs the NAND flash memory chip 501 to program the transferred user data in the SLC mode (step S33). As a result, the transferred user data is programmed into an SLC write destination block in the memory cell array 502 provided in the NAND flash memory chip 501.

Next, the controller 4 updates the LUT 26 (step S34) and updates the LBA range/write mode table 27 (step S35). Then, the controller 4 releases the area in the SLC write buffer 22 in which the transferred user data is stored (step S36).

Thus, user data stored in the SLC write buffer 22 can be written into the NAND flash memory 5 in the SLC mode.

Figure 20:
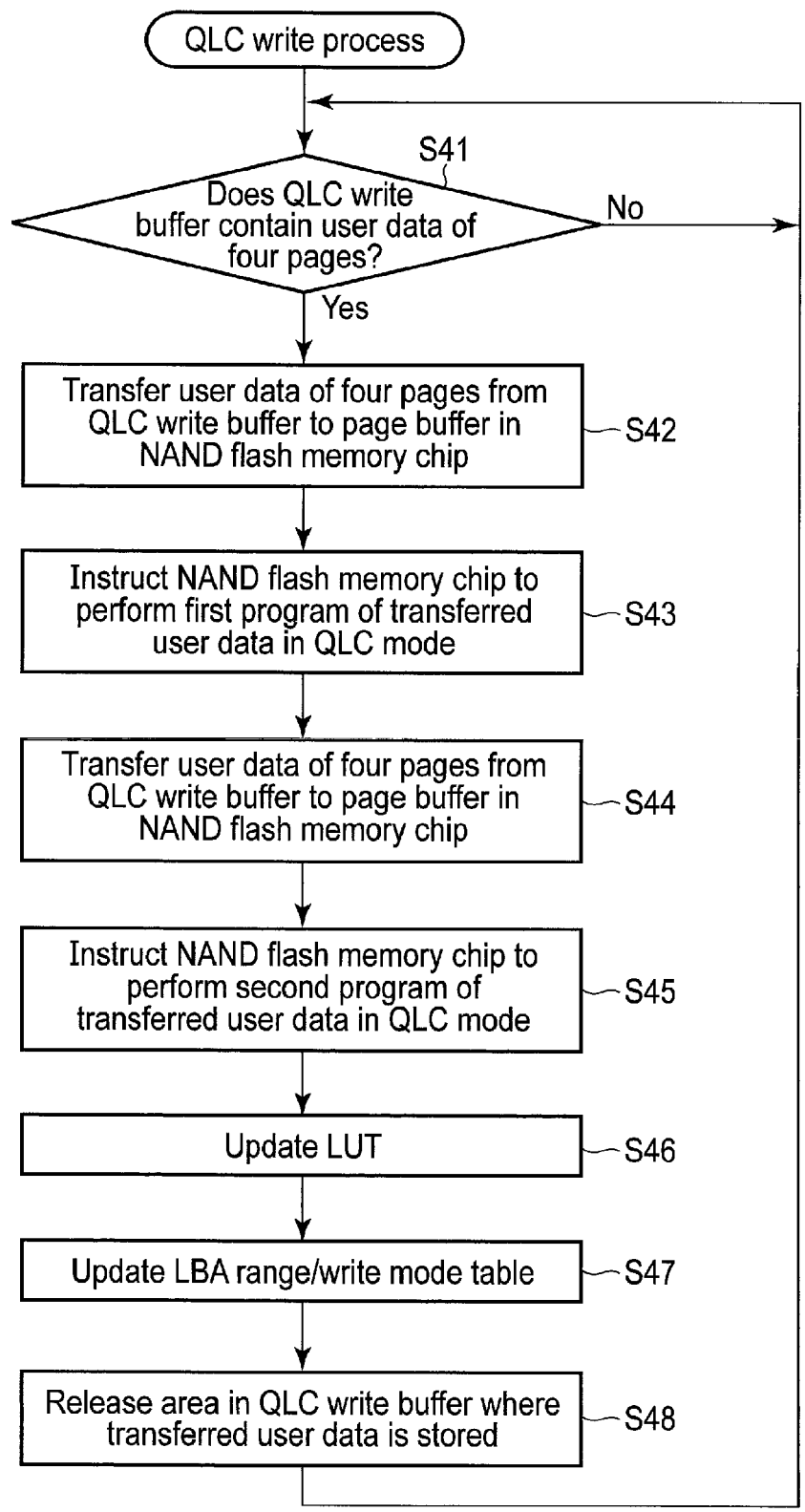
FIG. 20 is a flowchart of an example of the procedure of a QLC write process executed in the memory system of the embodiment.

The flowchart of FIG. 20 illustrates an example of the procedure of the QLC write process performed by the controller 4. In the QLC write process, user data stored in the QLC write buffer 21 is written into the NAND flash memory 5 in the QLC mode.

First, the controller 4 determines whether user data of four pages is stored in the QLC write buffer 21 (step S41). When user data of four pages is not stored (NO in step S41), the process returns to step S41.

On the other hand, when user data of four pages are stored (YES in step S41), the controller 4 transfers the user data of four pages from the QLC write buffer 21 to the page buffer 503 in the NAND flash memory chip 501 (step S42). The controller 4 instructs the NAND flash memory chip 501 to perform a first program of the transferred user data in the QLC mode (step S43).

Next, the controller 4 transfers the user data of four pages from the QLC write buffer 21 to the page buffer 503 in the NAND flash memory chip 501 again (step S44). The transferred user data is the same as the user data transferred in step S42. The controller 4 instructs the NAND flash memory chip 501 to perform a second program of the transferred user data in the QLC mode (step S45). In accordance with the first and second program instructions, the transferred user data is programmed into a QLC write destination block in the memory cell array 502 provided in the NAND flash memory chip 501.

The controller 4 updates the LUT 26 (step S46) and updates the LBA range/write mode table 27 (step S47). Then, the controller 4 releases the area in the QLC write buffer 21 in which the transferred user data is stored (step S48).

Thus, user data stored in the QLC write buffer 21 can be written into the NAND flash memory 5 in the QLC mode.

Figure 21:
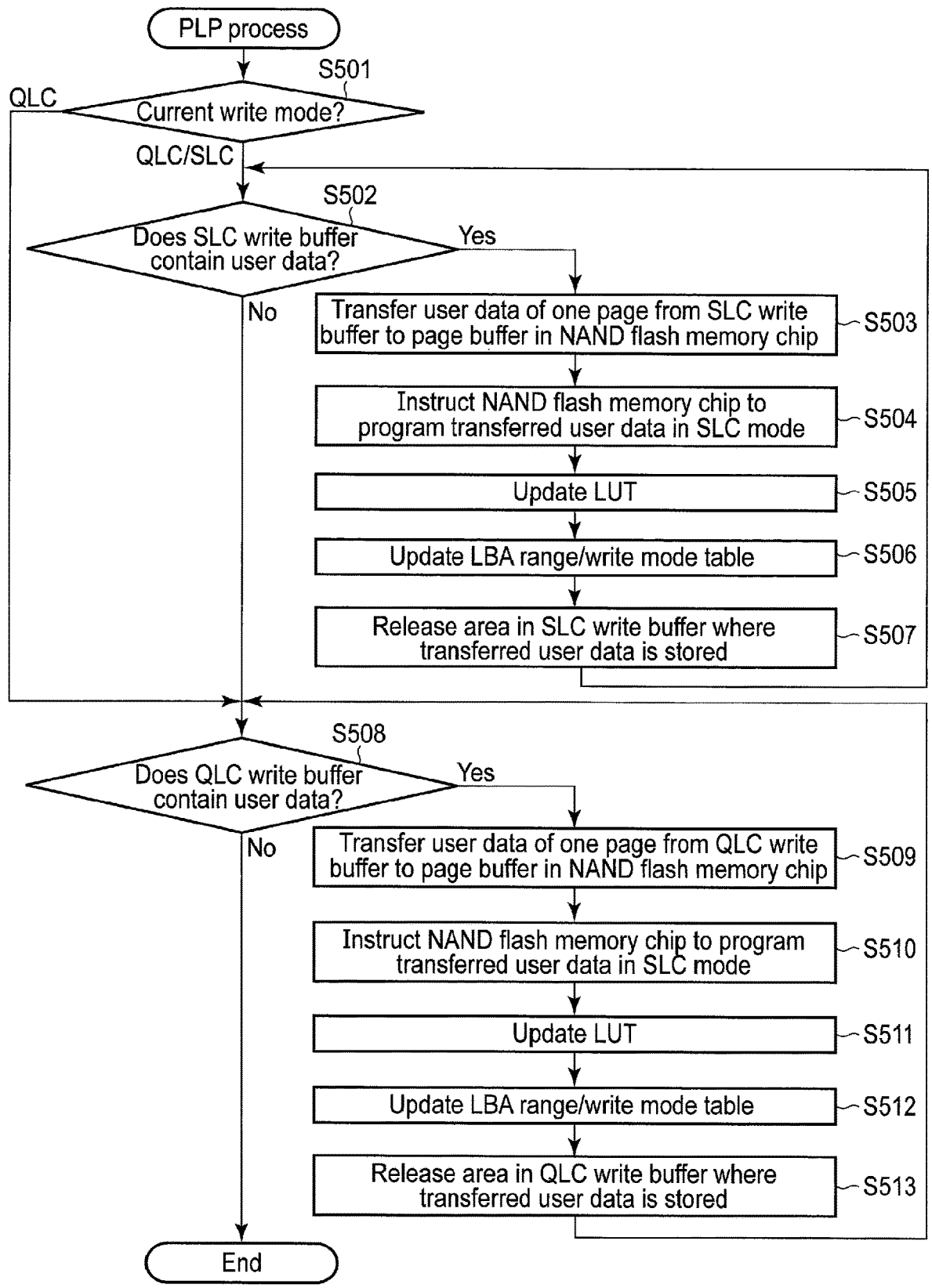
FIG. 21 is a flowchart of an example of the procedure of a power loss protection (PLP) process executed in the memory system of the embodiment.

The flowchart of FIG. 21 illustrates an example of the procedure of the PLP process performed by the controller 4. In the PLP process, in response to a shutoff of power supplied to the SSD 3, user data stored in the write buffer (or the write buffers) is written into the NAND flash memory 5 in the SLC mode using electric charge stored in the power storage device 71.

First, the process branches according to the current write mode (step S501). When the current write mode is the QLC/SLC combination mode (QLC/SLC in step S501), the controller 4 determines whether user data is stored in the SLC write buffer 22 (step S502).

When user data is stored in the SLC write buffer 22 (YES in step S502), the controller 4 transfers user data of one page from the SLC write buffer 22 to the page buffer 503 in the NAND flash memory chip 501 (Step S503). The controller 4 instructs the NAND flash memory chip 501 to program the transferred user data in the SLC mode (step S504). As a result, the transferred user data is programmed into an SLC write destination block in the memory cell array 502 provided in the NAND flash memory chip 501.

Next, the controller 4 updates the LUT 26 (step S505), and updates the LBA range/write mode table 27 (step S506). Then, the controller 4 releases the area in the SLC write buffer 22 in which the transferred user data is stored (step S507), and the process returns to step S502. The procedures from step S502 to step S507 are repeated until there is no user data stored in the SLC write buffer 22.

When user data is not stored in the SLC write buffer 22 (NO in step S502) or when the current write mode is the QLC single mode (QLC in step S501), the controller 4 determines whether user data is stored in the QLC write buffer 21 (step S508).

When user data is stored in the QLC write buffer 21 (YES in step S508), the controller 4 transfers user data of one page from the QLC write buffer 21 to the page buffer 503 in the NAND flash memory chip 501 (step S509). The controller 4 instructs the NAND flash memory chip 501 to program the transferred user data in the SLC mode (step S510). As a result, the transferred user data is programmed into an SLC write destination block in the memory cell array 502 provided in the NAND flash memory chip 501. That is, the user data stored in the QLC write buffer 21 is written in the SLC mode whose speed is high and in which the necessary electric charge amount is small, compared with the case of a write operation in the QLC mode.

Subsequently, the controller 4 updates the LUT 26 (step S511) and updates the LBA range/write mode table 27 (step S512). Then, the controller 4 releases the area in the QLC write buffer 21 in which the transferred user data is stored (step S513), and the process returns to step S508. The procedures from step S508 to step S513 are repeated until there is no user data stored in the QLC write buffer 21.

When user data is not stored in the QLC write buffer 21 (NO in step S508), the process ends.

As described above, when power supplied to the SSD 3 is shut off, (1) in a case where the current write mode is the QLC single mode, all the user data stored in the QLC write buffer 21 is written into the NAND flash memory 5 in the SLC mode, and (2) in a case where the current write mode is the QLC/SLC combination mode, all the user data stored in the QLC write buffer 21 and all the user data stored in the SLC write buffer 22 are written into the NAND flash memory 5 in the SLC mode. In this manner, in the PLP process, not only the user data stored in the SLC write buffer 22 but also the user data stored in the QLC write buffer 21 are written into the NAND flash memory 5 in the SLC mode whose speed is high and in which the necessary electric charge amount is small. Therefore, when power supplied to the SSD 3 is shut off, user data buffered in the DRAM 6 is not lost and is written into the NAND flash memory 5 by using the limited electric charge stored in the power storage device 71.

Figure 22:
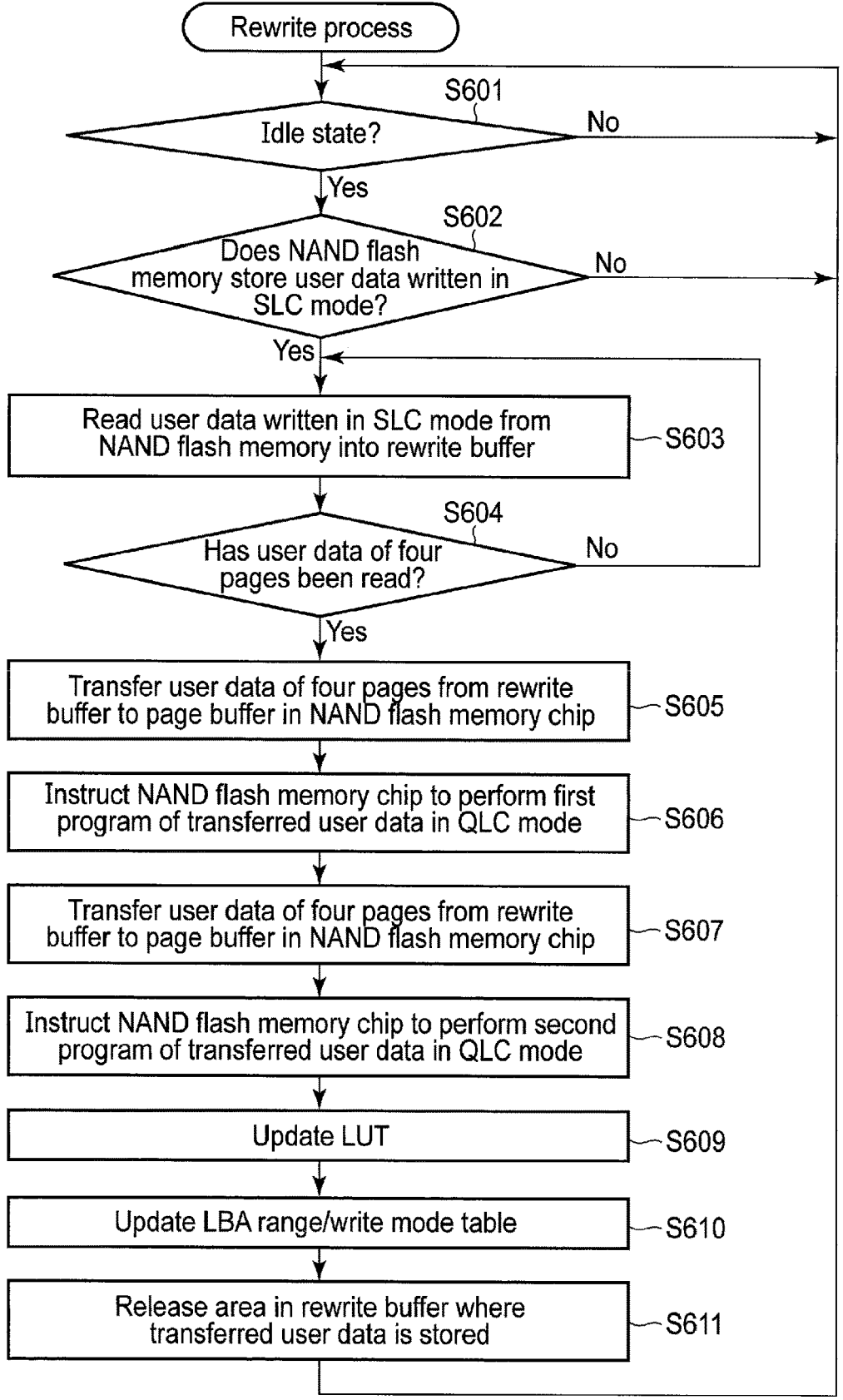
FIG. 22 is a flowchart of an example of the procedure of a rewrite process executed in the memory system of the embodiment.

The flowchart of FIG. 22 illustrates an example of the procedure of the rewrite process performed by the controller 4. In the rewrite process, the controller 4 writes user data, which is temporarily written into the NAND flash memory 5 in the SLC mode, into the NAND flash memory 5 in the QLC mode while the SSD 3 is in an idle state.

First, the controller 4 determines whether the SSD 3 is in the idle state (step S601). The idle state indicates, for example, a state in which a usage amount or usage rate of various resources (for example, the CPU 12, the DRAM 6, etc.) in the SSD 3 is equal to or lower than a second threshold. When the SSD 3 is not in the idle state (NO in step S601), the process returns to step S601, and it is again determined whether the SSD 3 is in the idle state.

When the SSD 3 is in the idle state (YES in step S601), the controller 4 determines whether there is any user data written in the SLC mode in the NAND flash memory 5 (step S602). For example, when the LBA range/write mode table 27 includes an entry in which a write mode is the SLC mode, the controller 4 determines that there is user data written in the SLC mode in the NAND flash memory 5. When there is no user data written in the SLC mode (NO in step S602), the process returns to step S601.

When there is user data written in the SLC mode (YES in step S602), the controller 4 reads the user data written in the SLC mode from the NAND flash memory 5 into the rewrite buffer 23 (step S603). Then, the controller 4 determines whether user data of four pages has been read into the rewrite buffer 23 (step S604). When user data of four pages has not been read (NO in step S604), the process returns to step S603, and user data written in the SLC mode is further read from the NAND flash memory 5 into the rewrite buffer 23.

On the other hand, when user data of four pages has been read (YES in step S604), the controller 4 transfers the user data of four pages from the rewrite buffer 23 to the page buffer 503 in the NAND flash memory chip 501 (Step S605). The controller 4 instructs the NAND flash memory chip 501 to perform a first program of the transferred user data in the QLC mode (step S606).

Next, the controller 4 transfers the user data of four pages from the rewrite buffer 23 to the page buffer 503 in the NAND flash memory chip 501 again (step S607). The transferred user data is the same as the user data transferred in step S605. The controller 4 instructs the NAND flash memory chip 501 to perform a second program of the transferred user data in the QLC mode (step S608). In accordance with the first and second program instructions, the transferred user data is programmed into a QLC write destination block in the memory cell array 502 provided in the NAND flash memory chip 501.

The controller 4 updates the LUT 26 (step S609) and updates the LBA range/write mode table 27 (step S610). Then, the controller 4 releases the area in the rewrite buffer 23 in which the transferred user data is stored (step S611), and the process returns to step S601.

As described above, user data written into the NAND flash memory 5 in the SLC mode can be rewritten in the QLC mode.

As described above, according to the present embodiment, it is possible to efficiently utilize a nonvolatile memory while satisfying a requirement of a write speed by the host 2. The DRAM 6 stores user data that is received from the host 2 in accordance with acceptance of a write command. The controller 4 is electrically connected to the NAND flash memory 5 and the DRAM 6, and selects, as a write mode, at least one of a first mode in which N-bit data is written per memory cell of the NAND flash memory 5 and a second mode in which M-bit data is written per memory cell of the NAND flash memory 5. N is equal to or larger than one and M is larger than N. The controller 4 writes the data stored in the DRAM 6 into the NAND flash memory 5 in the selected write mode. The controller 4 selects the second mode as the write mode when a reception speed of data received from the host 2 in accordance with acceptance of one or more write commands is equal to or slower than a threshold, and selects the first mode as the write mode when the reception speed is faster than the threshold.

Thus, when the reception speed of data received from the host 2 in accordance with the acceptance of the write commands is equal to or slower than the threshold, user data may be written into the NAND flash memory 5 in the second mode in which the storage density is higher, and when the reception speed is faster than the threshold, the user data may be written into the NAND flash memory 5 using the first mode having high write performance. Therefore, it is possible to efficiently utilize the NAND flash memory 5 while satisfying the write speed to the NAND flash memory 5 which is required to cope with the reception speed of the user data from the host 2.

Further, by using the PLP function, an amount of user data to be written from the write buffer into the NAND flash memory 5 when power supplied from the external power source to the SSD 3 is shut off can be reduced. Therefore, it is possible to reduce an amount of electric charge to be stored in the power storage device 71, which is required for the operation of the PLP function.

Each of various functions described in some embodiments of the present invention may be realized by a circuit (e.g., processing circuit). An exemplary processing circuit may be a programmed processor such as central processing unit (CPU). The processor executes computer programs (instructions) stored in a memory thereby perform the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory;
a random access memory configured to store data that is received from a host in accordance with acceptance of a write command; and
a controller electrically connected to the nonvolatile memory and the random access memory, the controller configured to write data into the nonvolatile memory in a first mode or a second mode, the first mode being a mode in which N-bit data is written per memory cell in the nonvolatile memory, the second mode being a mode in which M-bit data is written per memory cell in the nonvolatile memory, N being equal to or larger than one, M being larger than N, wherein the controller is further configured to:
while a reception speed of third data is equal to or slower than a threshold, the third data being received in accordance with acceptance of one or more write commands from the host, the reception speed being a speed of the third data sent from the host to the random access memory,
allocate a second memory area in the random access memory as a second buffer, the second buffer being used for storing the third data sent from the host as second data to be written into the nonvolatile memory in the second mode,
store the third data sent from the host as the second data in the second memory area, and
write the second data stored in the second memory area into the nonvolatile memory in the second mode; and
upon the reception speed of the third data becoming faster than the threshold,
additionally allocate a first memory area in the random access memory as a first buffer, the first buffer being used for storing the third data sent from the host as first data to be written into the nonvolatile memory in the first mode, a capacity of the first memory area being smaller than a capacity of the second memory area, a total capacity of the first memory area and the second memory area being smaller than a capacity of a third memory area in the random access memory, the third memory area being allocated in a case where fourth data sent from the host to the random access memory with a reception speed faster than the threshold is written into the nonvolatile memory only in the second mode, the capacity of the third memory area being determined such that a writing speed of the fourth data from the random access memory to the nonvolatile memory in the second mode can satisfy a requirement to cope with the reception speed of the fourth data that is faster than the threshold,
store the third data sent from the host as the second data in the second memory area more preferentially than the first data in the first memory area,
in a case where the second memory area has no available space to store the third data, store the third data sent from the host as the first data in the first memory area, write the second data stored in the second memory area into the nonvolatile memory in the second mode, and write the first data stored in the first memory area into the nonvolatile memory in the first mode.

2. The memory system of claim 1, further comprising a power storage device, wherein the controller is further configured to write data stored in the random access memory into the nonvolatile memory in the first mode by using electric charge stored in the power storage device when power supplied from an external power source to the memory system is shut off.

3. The memory system of claim 1, wherein the controller is further configured to write data, which has been written in the nonvolatile memory in the first mode, into the nonvolatile memory in the second mode when the memory system is in an idle state.

4. The memory system of claim 1, wherein the controller is further configured to:

when the reception speed is faster than the threshold, determine a ratio between a first data amount to be written into the nonvolatile memory in the first mode and a second data amount to be written into the nonvolatile memory in the second mode based on the reception speed.

5. The memory system of claim 4, wherein the controller is further configured to increase a ratio of the first data amount to a sum of the first data amount and the second data amount as the reception speed increases.

6. The memory system of claim 1, further comprising a power storage device, wherein the controller is further configured to:

write the second data stored in the second buffer into the nonvolatile memory in the first mode using electric charge stored in the power storage device when power supplied from an external power source to the memory system is shut off while the reception speed is equal to or slower than the threshold; and write the first data stored in the first buffer and the second data stored in the second buffer into the nonvolatile memory in the first mode using electric charge stored in the power storage device when power supplied from the external power source to the memory system is shut off while the reception speed is faster than the threshold.

7. The memory system of claim 1, wherein the controller is further configured to write, when the reception speed faster than the threshold becomes equal to or slower than the threshold, the first data stored in the first buffer into the nonvolatile memory in the first mode and release the first buffer.

8. The memory system of claim 1, wherein the controller is further configured to calculate the reception speed based on an amount of the third data received from the host in accordance with acceptance of one or more write commands within a first time period.

9. A method of controlling a memory system, the memory system comprising a nonvolatile memory, and a random access memory configured to store data that is received from a host in accordance with acceptance of a write command, the method comprising:

writing data into the nonvolatile memory in a first mode or a second mode, the first mode being a mode in which N-bit data is written per memory cell in the nonvolatile memory, the second mode being a mode in which M-bit data is written per memory cell in the nonvolatile memory, N being equal to or larger than one, M being larger than N;

while a reception speed of third data is equal to or slower than a threshold, the third data being received in accordance with acceptance of one or more write commands from the host, the reception speed being a speed of the third data sent from the host to the random access memory, allocating a second memory area in the random access memory as a second buffer, the second buffer being used for storing the third data sent from the host as second data to be written into the nonvolatile memory in the second mode, storing the third data sent from the host as the second data in the second memory area, and writing the second data stored in the second memory area into the nonvolatile memory in the second mode; and upon the reception speed of the third data becoming faster than the threshold, additionally allocating a first memory area in the random access memory as a first buffer, the first buffer being used for storing the third data sent from the host as first data to be written into the nonvolatile memory in the first mode, a capacity of the first memory area being smaller than a capacity of the second memory area, a total capacity of the first memory area and the second memory area being smaller than a capacity of a third memory area in the random access memory, the third memory area being allocated in a case where fourth data sent from the host to the random access memory with a reception speed faster than the threshold is written into the nonvolatile memory only in the second mode, the capacity of the third memory area being determined such that a writing speed of the fourth data from the random access memory to the nonvolatile memory in the second mode can satisfy a requirement to cope with the reception speed of the fourth data that is faster than the threshold, storing the third data sent from the host as the second data in the second memory area more preferentially than the first data in the first memory area, in a case where the second memory area has no available space to store the third data, storing the third data sent from the host as the first data in the first memory area;

writing the second data stored in the second memory area into the nonvolatile memory in the second mode, and writing the first data stored in the first memory area into the nonvolatile memory in the first mode.

10. The method of claim 9, wherein the memory system further comprises a power storage device, and the method further comprises writing data stored in the random access memory into the nonvolatile memory in the first mode by using electric charge stored in the power storage device when power supplied from an external power source to the memory system is shut off.

11. The method of claim 9, further comprising writing data, which has been written in the nonvolatile memory in the first mode, into the nonvolatile memory in the second mode when the memory system is in an idle state.

12. The method of claim 9, further comprising:

when the reception speed is faster than the threshold,
    determining a ratio between a first data amount to be written into the nonvolatile memory in the first mode and a second data amount to be written into the nonvolatile memory in the second mode based on the reception speed.

13. The method of claim 12, further comprising increasing a ratio of the first data amount to a sum of the first data amount and the second data amount as the reception speed increases.

14. The method of claim 9, wherein
the memory system further comprises a power storage device, and
the method further comprises:
    writing the second data stored in the second buffer into the nonvolatile memory in the first mode using electric charge stored in the power storage device when power supplied from an external power source to the memory system is shut off while the reception speed is equal to or slower than the threshold; and
    writing the first data stored in the first buffer and the second data stored in the second buffer into the nonvolatile memory in the first mode using electric charge stored in the power storage device when power supplied from the external power source to the memory system is shut off while the reception speed is faster than the threshold.

* * * * *